United States Patent
Zhao et al.

(10) Patent No.: US 10,075,324 B2
(45) Date of Patent: Sep. 11, 2018

(54) PREDISTORTION PROCESSING APPARATUS AND METHOD

(71) Applicant: Huawei Technologies Co., Ltd., Shenzhen (CN)

(72) Inventors: Yanqing Zhao, Chengdu (CN); Chunlei Yu, Chengdu (CN); Tingjian Tian, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/599,956

(22) Filed: May 19, 2017

(65) Prior Publication Data
US 2017/0257251 A1 Sep. 7, 2017

Related U.S. Application Data

(63) Continuation of application No. PCT/CN2014/091668, filed on Nov. 19, 2014.

(51) Int. Cl.
*H04L 27/36* (2006.01)
*H04L 25/03* (2006.01)
(Continued)

(52) U.S. Cl.
CPC ......... *H04L 27/368* (2013.01); *H03F 1/3247* (2013.01); *H03F 1/3258* (2013.01);
(Continued)

(58) Field of Classification Search
CPC ........... H03F 1/3247; H03F 2201/3233; H03F 1/3241; H03F 2201/3209; H04L 27/368; H04L 25/03343
See application file for complete search history.

(56) References Cited

U.S. PATENT DOCUMENTS 6,141,390 A 10/2000 Cova
2002/0181611 A1* 12/2002 Kim ................... H04L 27/368
375/296
(Continued)

FOREIGN PATENT DOCUMENTS

CN 1689295 A 10/2005
CN 101156159 A 4/2008
(Continued)

*Primary Examiner* — David S Huang
(74) *Attorney, Agent, or Firm* — Slater Matsil, LLP

(57) ABSTRACT

A predistortion processing apparatus: an auxiliary feedback module, configured to: extract a nonlinear distortion signal from an analog signal, and input an obtained feedback signal corresponding to the nonlinear distortion signal into an auxiliary model coefficient training module; the auxiliary model coefficient training module, configured to: train an auxiliary coefficient according to the feedback signal and a predistortion signal, and transmit a first auxiliary coefficient obtained through training to a predistortion processing module; a radio frequency signal feedback module, configured to extract a fundamental wave feedback signal; a predistortion model coefficient training module, configured to: train a predistortion coefficient according to the predistortion signal and the fundamental wave feedback signal, and transmit an obtained predistortion coefficient to the predistortion processing module; the predistortion processing module, configured to: perform predistortion processing on an input intermediate frequency signal by performing nonlinear modeling according to the first auxiliary coefficient and the predistortion coefficient.

20 Claims, 4 Drawing Sheets

(51) Int. Cl.
*H03F 1/32* (2006.01)
*H03F 3/189* (2006.01)
*H03F 3/24* (2006.01)

(52) U.S. Cl.
CPC ........... *H03F 1/3294* (2013.01); *H03F 3/189* (2013.01); *H03F 3/245* (2013.01); *H04L 25/03343* (2013.01); *H03F 2200/102* (2013.01); *H03F 2201/32* (2013.01); *H03F 2201/3233* (2013.01)

(56) References Cited

U.S. PATENT DOCUMENTS

| | | | |
|---|---|---|---|
| 2003/0184372 A1* | 10/2003 | Fudaba | H03F 1/3241 330/149 |
| 2005/0195919 A1 | 9/2005 | Cova | |
| 2006/0133535 A1* | 6/2006 | Jung | H01Q 3/267 375/296 |
| 2006/0240786 A1 | 10/2006 | Liu | |
| 2008/0106333 A1* | 5/2008 | Liu | H03F 1/3241 330/149 |
| 2008/0265996 A1* | 10/2008 | Kim | H03F 1/3247 330/291 |
| 2013/0121440 A1 | 5/2013 | Cai et al. | |

FOREIGN PATENT DOCUMENTS

| | | |
|---|---|---|
| CN | 102413083 A | 4/2012 |
| CN | 102487367 A | 6/2012 |
| CN | 103581082 A | 2/2014 |
| EP | 2787651 A1 | 10/2014 |
| JP | 2011103540 A | 5/2011 |
| WO | 9737427 | 10/1997 |

* cited by examiner

PREDISTORTION PROCESSING APPARATUS AND METHOD

CROSS-REFERENCE TO RELATED APPLICATIONS

This application is a continuation of International Application No. PCT/CN2014/091668, filed on Nov. 19, 2014, the disclosure of which is hereby incorporated by reference in its entirety.

TECHNICAL FIELD

The present invention relates to the field of linear modulation technologies, and in particular, to a predistortion processing apparatus and method.

BACKGROUND

With development of mobile communications technologies and increasingly high requirements of mobile communications users, application scenarios of the mobile communications technologies are becoming more complex. For a mobile communications system, various signal systems may coexist for a long period of time, so as to adapt to a more complex mobile communications application scenario. A power amplifier PA is an important composition part of a radio frequency processing unit RRU (Radio Remote Unit) of a mobile communications system. Nonlinearity and a memory effect of the PA may cause nonlinear distortion of a signal output by the power amplifier, resulting in distortion of the signal output by the PA and an increase in leakage of out-of-band power of the signal, and in a severe case, a receiver cannot correctly receive the signal and interference is caused to a communications system in an adjacent frequency band. Usually, a digital pre-distortion technology DPD and an RRU that has multiple frequency bands, multiple systems, and an ultra-wideband characteristic are used to reduce nonlinear distortion of the signal output by the PA. Generally, a DPD module is designed before the PA. A nonlinear distortion generated by a digital intermediate frequency signal by using the DPD module and a nonlinear distortion generated by the PA cancel out each other, thereby improving a degree of linearity of an output of the PA.

In the prior art, a feedback signal and a signal that is output by a predistortion circuit are used as input signals of a predistortion coefficient learning circuit. Predistortion model coefficient training is separately performed on each frequency band, to obtain nonlinear model coefficients corresponding to N frequency bands. A predistortion coefficient obtained after the training is replicated for a predistortion circuit. Nonlinear modeling of the predistortion circuit is then performed for a power amplifier according to the predistortion coefficient.

However, in a wideband communications system, a design of an ultra wideband power amplifier is limited by device performance, and it is difficult to optimize low frequency envelop impedance. An insufficient video bandwidth causes a relatively strong electrical memory effect of a power amplifier. In addition, a harmonic frequency range is wider, it is also difficult to optimize harmonic impedance, and enhancement of the electrical memory effect is also caused. In a conventional digital predistortion technology, a feedback channel feeds back only a fundamental wave signal, and cannot feed back a fundamental wave signal and a harmonic signal in real time. As a result, a predistortion processing circuit can perform nonlinear modeling of a predistortion circuit by using only information about the fundamental wave signal, and cannot perform nonlinear modeling of the predistortion circuit in real time by using information included in an envelope signal and a harmonic signal that are output by a power amplifier, causing lowered accuracy of nonlinear modeling of the predistortion circuit and a degraded performance indicator of the predistortion circuit.

SUMMARY

The present invention provides a predistortion processing apparatus and method, so as to resolve a problem in the prior art of low accuracy of predistortion modeling for a predistortion processing circuit in a wideband communications system.

A first aspect of the present invention provides a predistortion processing apparatus. The apparatus includes an auxiliary feedback module that is configured to receive an amplified analog signal, extract a nonlinear distortion signal from the amplified analog signal, obtain a feedback signal corresponding to the nonlinear distortion signal, and input the feedback signal into an auxiliary model coefficient training module. The auxiliary model coefficient training module is configured to receive the feedback signal and a predistortion signal that is output by a predistortion processing module, train an auxiliary coefficient of the auxiliary model coefficient training module according to the feedback signal and the predistortion signal that is output by the predistortion processing module, and transmit a first auxiliary coefficient obtained through training to the predistortion processing module. The apparatus further includes a radio frequency signal feedback module that is configured to receive the amplified analog signal, extract a fundamental wave signal from the amplified analog signal, obtain a fundamental wave feedback signal corresponding to the fundamental wave signal, and input the fundamental wave feedback signal into a predistortion model coefficient training module. The predistortion model coefficient training module is configured to receive the fundamental wave feedback signal and the predistortion signal that is output by the predistortion processing module, train a predistortion coefficient of the predistortion model coefficient training module according to the fundamental wave feedback signal and the predistortion signal that is output by the predistortion processing module, and transmit a predistortion coefficient obtained through training to the predistortion processing module. The predistortion processing module is configured to perform predistortion processing on an input intermediate frequency signal by performing nonlinear modeling according to the first auxiliary coefficient and the predistortion coefficient, and output a predistortion signal obtained through predistortion processing.

With reference to the first aspect, in a first implementation manner of the first aspect of embodiments of the present invention, the nonlinear distortion signal includes an envelope signal, and the auxiliary feedback module is specifically configured to: receive the amplified analog signal, extract the envelope signal from the amplified analog signal, perform sampling processing on the envelope signal, obtain an envelope feedback signal corresponding to the envelope signal, and input the envelope feedback signal into the auxiliary model coefficient training module.

With reference to the first aspect or the first implementation manner of the first aspect, in a second implementation manner of the first aspect of the embodiments of the present invention, the predistortion processing module includes a first auxiliary filtering submodule and a first predistortion processing submodule, and the predistortion model coefficient training module includes a second auxiliary filtering submodule and a first predistortion coefficient processing submodule. The auxiliary model coefficient training module is configured to: train the auxiliary coefficient of the auxiliary model coefficient training module by performing modeling by using the predistortion signal and the envelope feedback signal that are input into the auxiliary model coefficient training module, to obtain a second auxiliary coefficient after training, and transmit the second auxiliary coefficient to the first auxiliary filtering submodule and the second auxiliary filtering submodule.

With reference to the second implementation manner of the first aspect, in a third implementation manner of the first aspect of the embodiments of the present invention, the first auxiliary filtering submodule is configured to: construct, according to the intermediate frequency signal input into the predistortion processing module, an envelope reference signal corresponding to the intermediate frequency signal, perform filtering processing on the envelope reference signal by using the second auxiliary coefficient, and input an obtained first output signal into the first predistortion processing submodule. The first predistortion processing submodule is configured to: generate a predistortion vector according to a preset predistortion model by using the first output signal output by the first auxiliary filtering submodule and a clipping-processed baseband signal that is input into the predistortion processing module, multiply the predistortion vector by the predistortion coefficient to obtain the predistortion signal, and output the predistortion signal. The second auxiliary filtering submodule is configured to: perform, by using the second auxiliary coefficient, filtering processing on the fundamental wave feedback signal output by the radio frequency signal feedback module, and input an obtained second output signal into the first predistortion coefficient processing submodule. The first predistortion coefficient processing submodule is configured to: perform nonlinear modeling according to the second output signal, the fundamental wave feedback signal input into the first predistortion coefficient processing submodule, and the predistortion signal, and train the predistortion coefficient of the predistortion model coefficient training module, to obtain the predistortion coefficient.

With reference to the first aspect, in a fourth implementation manner of the first aspect of the embodiments of the present invention, the nonlinear distortion signal includes an envelope signal and a harmonic signal, and the auxiliary feedback module is specifically configured to: receive the amplified analog signal, extract the envelope signal and the harmonic signal from the amplified analog signal, perform sampling processing on the envelope signal and the harmonic signal, obtain an envelope feedback signal corresponding to the envelope signal and a harmonic feedback signal corresponding to the harmonic signal, and input the envelope feedback signal and the harmonic feedback signal into the auxiliary model coefficient training module.

With reference to the first aspect or the fourth implementation manner of the first aspect, in a fifth implementation manner of the first aspect of the embodiments of the present invention, the predistortion processing module includes a third auxiliary filtering submodule and a second predistortion processing submodule, and the predistortion model coefficient training module includes a fourth auxiliary filtering submodule and a second predistortion coefficient processing submodule. The auxiliary model coefficient training module is specifically configured to: train the auxiliary coefficient of the auxiliary model coefficient training module by performing modeling by using the predistortion signal, the envelope feedback signal, and the harmonic feedback signal that are input into the auxiliary model coefficient training module, to obtain a third auxiliary coefficient after training, and transmit the third auxiliary coefficient to the third auxiliary filtering submodule and the fourth auxiliary filtering submodule.

With reference to the fifth implementation manner of the first aspect, in a sixth implementation manner of the first aspect of the embodiments of the present invention, the third auxiliary filtering submodule is configured to: construct, according to the intermediate frequency signal input into the predistortion processing module, an envelope reference signal and a harmonic reference signal that correspond to the intermediate frequency signal, perform filtering processing on the envelope reference signal and the harmonic reference signal by using the third auxiliary coefficient, and input an obtained third output signal into the second predistortion processing submodule. The second predistortion processing submodule is configured to: generate a predistortion vector according to a preset predistortion model by using the third output signal output by the third auxiliary filtering submodule and a clipping-processed baseband signal that is input into the predistortion processing module, multiply the predistortion vector by the predistortion coefficient to obtain the predistortion signal, and output the predistortion signal. The fourth auxiliary filtering submodule is configured to: perform, by using the third auxiliary coefficient, filtering processing on the fundamental wave feedback signal output by the radio frequency signal feedback module, and input an obtained fourth output signal into the second predistortion coefficient processing submodule. The second predistortion coefficient processing submodule is configured to: perform nonlinear modeling according to the fourth output signal, a fundamental wave feedback signal input into the second predistortion coefficient processing submodule, and the predistortion signal, and train the predistortion coefficient of the predistortion model coefficient training module, to obtain the predistortion coefficient.

With reference to the first aspect, in a seventh implementation manner of the first aspect of the embodiments of the present invention, the nonlinear distortion signal includes a harmonic signal, and the auxiliary feedback module is specifically configured to: extract the harmonic signal from the amplified analog signal, perform sampling processing on the harmonic signal, to obtain a harmonic feedback signal corresponding to the harmonic signal, and input the harmonic feedback signal into the auxiliary model coefficient training module.

With reference to the first aspect or the seventh implementation manner of the first aspect, in an eighth implementation manner of the first aspect of the embodiments of the present invention, the predistortion processing module includes a fifth auxiliary filtering submodule and a third predistortion processing submodule, and the predistortion model coefficient training module includes a sixth auxiliary filtering submodule and a third predistortion coefficient processing submodule. The auxiliary model coefficient training module is specifically configured to: train the auxiliary coefficient of the auxiliary model coefficient training module by performing modeling by using the predistortion signal and the harmonic feedback signal that are input into the auxiliary model coefficient training module, to obtain a fourth auxiliary coefficient after training, and transmit the fourth auxiliary coefficient to the fifth auxiliary filtering submodule and the sixth auxiliary filtering submodule.

With reference to the first aspect or the eighth implementation manner of the first aspect, in a ninth implementation manner of the first aspect of the embodiments of the present invention, the fifth auxiliary filtering submodule is configured to: construct, according to the intermediate frequency signal input into the predistortion processing module, a harmonic reference signal corresponding to the intermediate frequency signal, perform filtering processing on the harmonic reference signal, and input a fifth output signal obtained by using the fourth auxiliary coefficient into the third predistortion processing submodule. The third predistortion processing submodule is configured to: generate a predistortion vector according to a preset predistortion model by using the fifth output signal output by the fifth auxiliary filtering submodule and a clipping-processed baseband signal that is input into the third predistortion processing submodule, multiply the predistortion vector by the predistortion coefficient to obtain the predistortion signal, and output the predistortion signal. The sixth auxiliary filtering submodule is configured to: perform, by using the fourth auxiliary coefficient, filtering processing on the fundamental wave feedback signal output by the radio frequency signal feedback module, and input an obtained sixth output signal into a predistortion model processing submodule. The third predistortion coefficient processing submodule is configured to: perform nonlinear modeling according to the sixth output signal, a fundamental wave feedback signal input into the third predistortion coefficient processing submodule, and the predistortion signal, and train the predistortion coefficient of the predistortion model coefficient training module, to obtain the predistortion coefficient.

With reference to the first aspect or any one of the first to the ninth implementation manners of the first aspect, in a tenth implementation manner of the first aspect of the embodiments of the present invention, the apparatus further includes a preprocessing module configured to: perform digital up-conversion on a baseband signal input into the preprocessing module, combine all carriers in a same frequency band, perform clipping processing after the combination, and input a baseband signal on which the clipping processing is performed into the predistortion processing module. The baseband signal includes carriers of multiple frequency bands. A signal combination and transmission module is configured to receive the predistortion signal output by the predistortion processing module, convert the predistortion signal output by the predistortion processing module into an analog signal, and output the analog signal to a power amplification module. The power amplification module is configured to amplify the analog signal input into the power amplification module, and output the amplified analog signal to the auxiliary feedback module and the radio frequency signal feedback module.

A second aspect of the present invention provides a predistortion processing method, where the method includes receiving, by an auxiliary feedback module, an amplified analog signal, extracting a nonlinear distortion signal from the amplified analog signal, obtaining a feedback signal corresponding to the nonlinear distortion signal, and inputting the feedback signal into an auxiliary model coefficient training module. The method further includes receiving, by the auxiliary model coefficient training module, the feedback signal and a predistortion signal that is output by a predistortion processing module, training an auxiliary coefficient of the auxiliary model coefficient training module according to the feedback signal and the predistortion signal that is output by the predistortion processing module, and transmitting a first auxiliary coefficient obtained through training to the predistortion processing module. The method further includes receiving, by a radio frequency signal feedback module, the amplified analog signal, extracting a fundamental wave signal from the amplified analog signal, obtaining a fundamental wave feedback signal corresponding to the fundamental wave signal, and inputting the fundamental wave feedback signal into a predistortion model coefficient training module. The method further includes receiving, by the predistortion model coefficient training module, the fundamental wave feedback signal and the predistortion signal that is output by the predistortion processing module, training a predistortion coefficient of the predistortion model coefficient training module according to the fundamental wave feedback signal and the predistortion signal that is output by the predistortion processing module, and transmitting a predistortion coefficient obtained through training to the predistortion processing module. The method further includes performing, by the predistortion processing module, predistortion processing on the input intermediate frequency signal by performing nonlinear modeling according to the first auxiliary coefficient and the predistortion coefficient, and outputting a predistortion signal obtained through predistortion processing.

With reference to the second aspect, in a first implementation manner of the second aspect of the embodiments of the present invention, the nonlinear distortion signal includes an envelope signal, and the receiving, by an auxiliary feedback module, an amplified analog signal, extracting a nonlinear distortion signal from the amplified analog signal, obtaining a feedback signal corresponding to the nonlinear distortion signal, and inputting the feedback signal into an auxiliary model coefficient training module specifically includes receiving, by the auxiliary feedback module, the amplified analog signal, extracting the envelope signal from the amplified analog signal, performing sampling processing on the envelope signal, obtaining an envelope feedback signal corresponding to the envelope signal, and inputting the envelope feedback signal into the auxiliary model coefficient training module.

With reference to the first implementation manner of the second aspect, in a second implementation manner of the second aspect of the present invention, the predistortion processing module includes a first auxiliary filtering submodule and a first predistortion processing submodule, the predistortion model coefficient training module includes a second auxiliary filtering submodule and a first predistortion coefficient processing submodule, and the method further includes training, by the auxiliary model coefficient training module, the auxiliary coefficient of the auxiliary model coefficient training module by performing modeling by using the predistortion signal and the envelope feedback signal that are input into the auxiliary model coefficient training module, to obtain a second auxiliary coefficient after training, and transmitting the second auxiliary coefficient to the first auxiliary filtering submodule and the second auxiliary filtering submodule.

With reference to the second implementation manner of the second aspect, in a third implementation manner of the second aspect of the present invention, the method further includes constructing, by the first auxiliary filtering submodule according to the intermediate frequency signal input into the predistortion processing module, an envelope reference signal corresponding to the intermediate frequency signal, performing filtering processing on the envelope reference signal by using the second auxiliary coefficient, and inputting an obtained first output signal into a predistortion processing submodule in the predistortion processing module. The method further includes generating, by the first predistortion processing submodule, a predistortion vector according to a preset predistortion model by using the first output signal output by the first auxiliary filtering submodule and a clipping-processed baseband signal that is input into the first predistortion processing submodule, multiplying the predistortion vector by the predistortion coefficient to obtain the predistortion signal, and outputting the predistortion signal. The method further includes performing, by the second auxiliary filtering submodule by using the second auxiliary coefficient, filtering processing on the fundamental wave feedback signal output by the radio frequency signal feedback module, and inputting an obtained second output signal into a predistortion model processing submodule. The method further includes performing, by the first predistortion coefficient processing submodule, nonlinear modeling according to the second output signal, the fundamental wave feedback signal input into the first predistortion coefficient processing submodule, and the predistortion signal, and training the predistortion coefficient of the predistortion model coefficient training module, to obtain the predistortion coefficient.

With reference to the second aspect, in a fourth implementation manner of the second aspect of the present invention, the nonlinear distortion signal includes an envelope signal and a harmonic signal, and the method further includes extracting, by the auxiliary feedback module, the envelope signal and the harmonic signal from the analog signal, performing sampling processing on the envelope signal and the harmonic signal, obtaining an envelope feedback signal corresponding to the envelope signal and a harmonic feedback signal corresponding to the harmonic signal, and inputting the envelope feedback signal and the harmonic feedback signal into the auxiliary model coefficient training module.

With reference to the second aspect or the fourth implementation manner of the second aspect, in a fifth implementation manner of the second aspect of the present invention, the predistortion processing module includes a third auxiliary filtering submodule and a second predistortion processing submodule, the predistortion model coefficient training module includes a fourth auxiliary filtering submodule and a second predistortion coefficient processing submodule, and the method further includes training, by the auxiliary model coefficient training module, the auxiliary coefficient by using the predistortion signal, the envelope feedback signal, and the harmonic feedback signal that are input into the auxiliary model coefficient training module, obtaining a third auxiliary coefficient after training, and transmitting the third auxiliary coefficient to the third auxiliary filtering submodule and the fourth auxiliary filtering submodule.

With reference to the fifth implementation manner of the second aspect, in a sixth implementation manner of the second aspect of the present invention, the method further includes constructing, by the third auxiliary filtering submodule according to the intermediate frequency signal input into the predistortion processing module, an envelope reference signal and a harmonic reference signal that correspond to the intermediate frequency signal, performing filtering processing on the envelope reference signal and the harmonic reference signal by using the third auxiliary coefficient, and inputting an obtained third output signal into the second predistortion processing submodule. The method further includes generating, by the second predistortion processing submodule, a predistortion vector according to a preset predistortion model by using the third output signal output by the third auxiliary filtering submodule and a clipping-processed baseband signal that is input into the second predistortion processing submodule, multiplying the predistortion vector by the predistortion coefficient to obtain the predistortion signal, and outputting the predistortion signal. The method further includes performing, by the fourth auxiliary filtering submodule by using the third auxiliary coefficient, filtering processing on the fundamental wave feedback signal output by the radio frequency signal feedback module, and inputting an obtained fourth output signal into the second predistortion coefficient processing submodule. The method further includes performing, by the second predistortion coefficient processing submodule, nonlinear modeling according to the fourth output signal, a fundamental wave feedback signal input into the second predistortion coefficient processing submodule, and the predistortion signal, and training the predistortion coefficient of the predistortion model coefficient training module, to obtain the predistortion coefficient.

With reference to the second aspect, in a seventh implementation manner of the second aspect of the embodiments of the present invention, the nonlinear distortion signal includes a harmonic signal, and the method further includes extracting, by the auxiliary feedback module, the harmonic signal from the analog signal, performing sampling processing on the harmonic signal, obtaining a harmonic feedback signal corresponding to the harmonic signal, and inputting the harmonic feedback signal into the auxiliary model coefficient training module.

With reference to the second aspect or the seventh implementation manner of the second aspect, in an eighth implementation manner of the second aspect of the embodiments of the present invention, the predistortion processing module includes a fifth auxiliary filtering submodule and a third predistortion processing submodule, the predistortion model coefficient training module includes a sixth auxiliary filtering submodule and a third predistortion coefficient processing submodule, and the method further includes training, by the auxiliary model coefficient training module, the auxiliary coefficient by using the predistortion signal and the harmonic feedback signal that are input into the auxiliary model coefficient training module, obtaining a fourth auxiliary coefficient after training, and transmitting the fourth auxiliary coefficient to the fifth auxiliary filtering submodule and the sixth auxiliary filtering submodule.

With reference to the second aspect or the eighth implementation manner of the second aspect, in a ninth implementation manner of the second aspect of the embodiments of the present invention, the method further includes constructing, by the fifth auxiliary filtering submodule according to the intermediate frequency signal input into the predistortion processing module, a harmonic reference signal corresponding to the intermediate frequency signal, performing filtering processing on the harmonic reference signal, and inputting a fifth output signal obtained by using the fourth auxiliary coefficient into the third predistortion processing submodule. The method further includes generating, by the third predistortion processing submodule, a predistortion vector according to a preset predistortion model by using the fifth output signal output by the fifth auxiliary filtering submodule and a clipping-processed baseband signal that is input into the third predistortion processing submodule, multiplying the predistortion vector by the predistortion coefficient to obtain the predistortion signal, and outputting the predistortion signal. The method further includes performing, by the sixth auxiliary filtering submodule by using the fourth auxiliary coefficient, filtering processing on the fundamental wave feedback signal output by the radio frequency signal feedback module, and inputting an obtained sixth output signal into a predistortion model processing submodule. The method further includes performing, by the third predistortion coefficient processing submodule, nonlinear modeling according to the sixth output signal, a fundamental wave feedback signal input into the third predistortion coefficient processing submodule, and the predistortion signal, and training the predistortion coefficient of the predistortion model coefficient training module, to obtain the predistortion coefficient.

With reference to the second aspect or any one of the first to the ninth implementation manners of the second aspect, in a tenth implementation manner of the second aspect of the embodiments of the present invention, the method further includes: performing, by a preprocessing module, digital up-conversion on a baseband signal input into the preprocessing module, combining all carriers in a same frequency band, performing clipping processing after the combination, and inputting a baseband signal on which the clipping processing is performed into the predistortion processing module, where the baseband signal includes carriers of multiple frequency bands; receiving, by a signal combination and transmission module, the predistortion signal output by the predistortion processing module, converting the predistortion signal output by the predistortion processing module into an analog signal, and outputting the analog signal to a power amplification module; and amplifying, by the power amplification module, the analog signal input into the power amplification module, and outputting the amplified analog signal to the auxiliary feedback module and the radio frequency signal feedback module.

It can be seen from the foregoing technical solutions that in the present invention, an auxiliary feedback module is added, to extract a nonlinear distortion signal from an analog signal, and obtain a feedback signal corresponding to the nonlinear distortion signal, thereby implementing real-time feedback of the nonlinear distortion signal. An auxiliary model coefficient training module is added, to train an auxiliary coefficient by using the feedback signal output by the auxiliary feedback module and a predistortion signal, and transmit an obtained first auxiliary coefficient to a predistortion processing module and a predistortion model coefficient training module, so that the predistortion processing module performs nonlinear modeling by using the first auxiliary coefficient and a predistortion coefficient that is obtained through training by the predistortion model coefficient training module, thereby effectively improving accuracy of nonlinear modeling, and improving performance of a digital predistortion technology in a wideband communications system.

DETAILED DESCRIPTION OF ILLUSTRATIVE EMBODIMENTS

Figure 1:
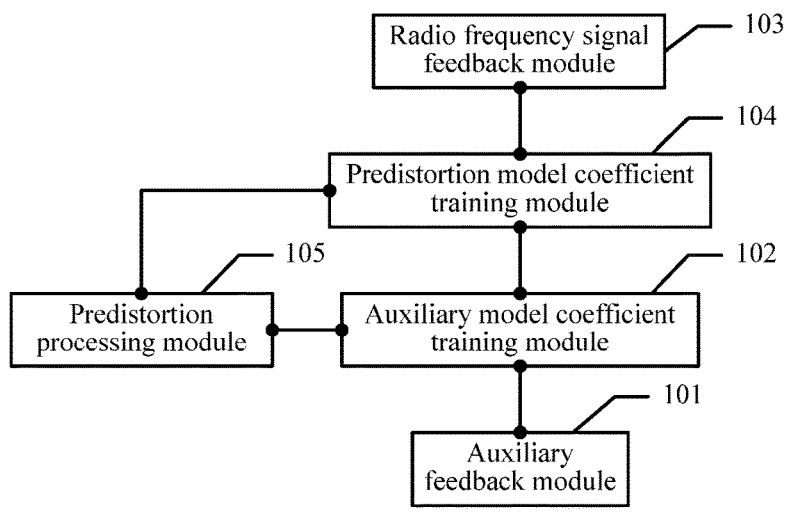
FIG. 1 is a schematic structural diagram of a predistortion processing apparatus according to an embodiment of the present invention.

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person skilled in the art based on the embodiments of the present invention without creative efforts shall fall within the protection scope of the present invention.

In the specification, claims, and accompanying drawings of the present invention, the terms "first", "second", "third", "fourth", and so on are intended to distinguish between similar objects but do not necessarily indicate a specific order or sequence. It should be understood that the data termed in such a way are interchangeable in proper circumstances so that the embodiments of the present invention described herein can be implemented in other orders than the order illustrated or described herein. Moreover, the terms "include", "contain" and any other variants mean to cover the non-exclusive inclusion, for example, a process, method, system, product, or device that includes a list of steps or modules is not necessarily limited to those steps or modules, but may include other steps or modules not expressly listed or inherent to such a process, method, system, product, or device. The module division in this specification is merely logical function division and may be other division in actual implementation. For example, multiple modules may be combined or integrated into another system, or some features may be ignored or not performed. In addition, the displayed or discussed mutual couplings or direct couplings or communication connections may be implemented by using some interfaces. The indirect couplings or communication connections between the modules may be implemented in electronic or other forms, which is not limited in this specification. In addition, the modules or submodules described as separate parts may or may not be physically separate, may or may not be physical modules, or may be distributed on multiple circuit modules. Some or all of the modules may be selected according to actual needs to achieve the objectives of the solutions of the embodiments in the present invention.

In the embodiments of the present invention, a predistortion processing apparatus and method can resolve the following problems in the prior art. In a wideband communications system, a feedback circuit feeds back only a fundamental wave signal and cannot feed back nonlinear distortion signals such as an envelope signal and a harmonic signal in real time. As a result, a predistortion processing circuit can perform predistortion modeling according to only a fundamental wave feedback signal, and cannot perform predistortion modeling in real time according to a nonlinear distortion signal such as an envelope signal or a harmonic signal, causing low accuracy of nonlinear modeling and a failure to accurately analyze nonlinear features of a power amplifier. The apparatus and method may be applied to the field of linear modulation, and is mainly applied to an RRU of a mobile communications system. A main application scenario of the apparatus and method is a wideband multi-band multiple-system mobile communications system. Generally, a DPD module is designed before the PA. A nonlinear distortion generated by a digital intermediate frequency signal by using the DPD module and a nonlinear distortion generated by the PA cancel out each other, thereby improving a degree of linearity of an output of the PA. In addition, different designs of PAs have different effects of correcting the degree of linearity of the power amplifier and DPD by using envelop impedance and harmonic impedance. Moreover, because the PA is a nonlinear device, a frequency of a signal output by the PA is a full spectrum frequency. If a signal whose frequency band is f is to be obtained, among corresponding signals output by the PA, a signal in the frequency band f is a fundamental wave signal, a signal in a frequency band that is an integer multiple (for example, an integer multiple such as 2f, 3f, or 4f) of the frequency band f is a harmonic signal, and a signal close to a frequency 0 is an envelope signal. Herein, the envelope signal is a response of an envelope of the fundamental wave signal in low frequency.

Therefore, the fundamental wave signal, the envelope signal, and the harmonic signal are all extracted from an analog signal. The fundamental wave signal is actually a signal to be transmitted by the circuit.

It should be noted that a predistortion signal that appears in this specification corresponds to a nonlinear distortion signal, and may include an envelope signal or a harmonic signal. The predistortion signal may be at least one of the envelope signal or the harmonic signal, or may be another similar signal that can cause nonlinear distortion or a memory effect. Specific signal components of a predistortion signal fed back by an auxiliary feedback module are not limited in this specification.

Moreover, in this specification, when the auxiliary feedback module feeds back at least one of an envelope signal or a harmonic signal, correspondingly, an auxiliary model coefficient training module, an auxiliary filtering submodule, and a predistortion model coefficient training module all change accordingly. For example, when the auxiliary feedback module feeds back only an envelope signal, the auxiliary model coefficient training module, the auxiliary filtering submodule, and the predistortion model coefficient training module accordingly process only a component related to an envelope feedback signal. This is not specifically limited in this specification.

In this specification, the auxiliary feedback module and a radio frequency signal feedback module may have a zero-intermediate frequency receiver architecture, or may have a digital intermediate frequency receiver architecture, a direct radio frequency receiver architecture, or another similar receiver architecture, provided that the architecture can implement functions described in this specification. A specific architecture is not limited in this specification.

The following describes an embodiment of a predistortion processing apparatus according to an embodiment of the present invention. The apparatus is applied to the field of linear modulation. Referring to FIG. 1, the predistortion processing apparatus of this embodiment of the present invention includes: an auxiliary feedback module 101, configured to: receive an amplified analog signal, extract a nonlinear distortion signal from the amplified analog signal, obtain a feedback signal corresponding to the nonlinear distortion signal, and input the feedback signal into an auxiliary model coefficient training module 102; the auxiliary model coefficient training module 102, configured to: receive the feedback signal and a predistortion signal that is output by a predistortion processing module 105, train an auxiliary coefficient of the auxiliary model coefficient training module 102 according to the feedback signal and the predistortion signal that is output by the predistortion processing module 105, to obtain a first auxiliary coefficient after training, and transmit the first auxiliary coefficient obtained through training to the predistortion processing module 105; a radio frequency signal feedback module 103, configured to: receive the amplified analog signal, extract a fundamental wave signal from the amplified analog signal, obtain a fundamental wave feedback signal corresponding to the fundamental wave signal, and input the fundamental wave feedback signal into a predistortion model coefficient training module 104; the predistortion model coefficient training module 104, configured to: receive the fundamental wave feedback signal and the predistortion signal that is output by the predistortion processing module 105, train a predistortion coefficient of the predistortion model coefficient training module 104 according to the fundamental wave feedback signal that is output by the radio frequency signal feedback module 103 and the predistortion signal that is output by the predistortion processing module 105, and transmit a predistortion coefficient obtained through training to the predistortion processing module 105; and the predistortion processing module 105, configured to: perform predistortion processing on an input intermediate frequency signal by performing nonlinear modeling according to the first auxiliary coefficient and the predistortion coefficient, and output a predistortion signal obtained through predistortion processing.

In this embodiment of the present invention, the auxiliary feedback module 101 extracts a nonlinear distortion signal from an analog signal, and obtains a feedback signal corresponding to the nonlinear distortion signal, thereby implementing real-time feedback of the nonlinear distortion signal. The auxiliary model coefficient training module 102 trains an auxiliary coefficient by using the feedback signal output by the auxiliary feedback module 101 and a predistortion signal that is output by the predistortion processing module 105, and transmits an obtained first auxiliary coefficient to the predistortion processing module 105 and the predistortion model coefficient training module 104. The predistortion processing module 105 performs nonlinear modeling by using the first auxiliary coefficient and a predistortion coefficient that is obtained through training by the predistortion model coefficient training module 104, thereby effectively improving accuracy of nonlinear modeling, and performs predistortion processing on an intermediate frequency signal, to obtain a predistortion signal, so that nonlinear demographic rates generated after predistortion processing has been performed on the intermediate frequency signal input into the predistortion processing apparatus and nonlinear demographic rates generated by a power amplifier cancel out each other, and performance of a digital predistortion technology in a case of wideband is improved.

Figure 2:
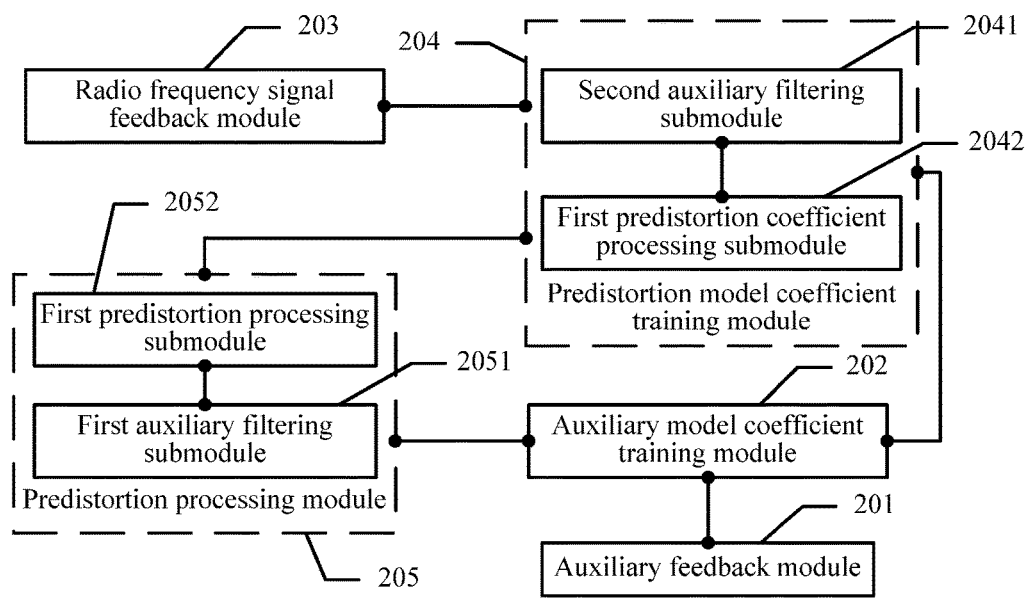
FIG. 2 is another schematic structural diagram of a predistortion processing apparatus according to an embodiment of the present invention.

Referring to FIG. 2, as an example, in this embodiment of the present invention, an auxiliary feedback module feeds back an envelope signal. Another embodiment of a predistortion processing apparatus in this embodiment of the present invention includes: an auxiliary feedback module 201, configured to: receive an amplified analog signal, extract a nonlinear distortion signal from the amplified analog signal, obtain a feedback signal corresponding to the nonlinear distortion signal, and input the feedback signal into an auxiliary model coefficient training module 202; the auxiliary model coefficient training module 202, configured to: train an auxiliary coefficient of the auxiliary model coefficient training module 202 according to the feedback signal and a predistortion signal that is output by a predistortion processing module 204, obtain a first auxiliary coefficient after training, and transmit the first auxiliary coefficient obtained through training to the predistortion processing module 204; a radio frequency signal feedback module 203, configured to: receive the amplified analog signal, extract a fundamental wave signal from the amplified analog signal, obtain a fundamental wave feedback signal corresponding to the fundamental wave signal, and input the fundamental wave feedback signal into a predistortion model coefficient training module 202; the predistortion model coefficient training module 204, configured to: receive the fundamental wave feedback signal and the predistortion signal that is output by the predistortion processing module 205, train a predistortion coefficient of the predistortion model coefficient training module 204 according to the predistortion signal that is output by the predistortion processing module 205 and the fundamental wave feedback signal that is output by the radio frequency signal feedback module 203, and transmit a predistortion coefficient obtained through training to the predistortion processing module 205; and the predistortion processing module 205, configured to: perform predistortion processing on the input intermediate frequency signal by performing nonlinear modeling according to the first auxiliary coefficient and the predistortion coefficient, and output a predistortion signal obtained through the predistortion processing.

Optionally, based on the foregoing embodiment corresponding to FIG. 2, the nonlinear distortion signal may include an envelope signal, the predistortion processing module 205 includes a first auxiliary filtering submodule 2051 and a first predistortion processing submodule 2052, and the predistortion model coefficient training module 204 includes a second auxiliary filtering submodule 2041 and a first predistortion coefficient processing submodule 2042.

The auxiliary feedback module 201 is specifically configured to: receive the amplified analog signal, extract the envelope signal from the amplified analog signal, perform sampling processing on the envelope signal, obtain an envelope feedback signal corresponding to the envelope signal, and input the envelope feedback signal into the auxiliary model coefficient training module 202.

The auxiliary model coefficient training module 202 is specifically configured to: train the auxiliary coefficient of the auxiliary model coefficient training module 202 by performing modeling by using the predistortion signal and the envelope feedback signal input into the auxiliary model coefficient training module 202, to obtain a second auxiliary coefficient after training, and transmit the second auxiliary coefficient to the first auxiliary filtering submodule 2051 and the second auxiliary filtering submodule 2041.

Optionally, the first auxiliary filtering submodule 2051 is configured to: construct, according to the intermediate frequency signal input into the predistortion processing module 205, an envelope reference signal corresponding to the intermediate frequency signal, perform filtering processing on the envelope reference signal, and input a first output signal obtained by using the second auxiliary coefficient into the first predistortion coefficient processing submodule 2042.

The first predistortion coefficient processing submodule 2042 is configured to: generate a predistortion vector according to a preset predistortion model by using the first output signal output by the first auxiliary filtering submodule 2051 and a clipping-processed baseband signal that is input into the predistortion processing module 204, multiply the predistortion vector by the predistortion coefficient to obtain the predistortion signal, and output the predistortion signal.

Optionally, the second auxiliary filtering submodule 2041 is configured to: perform, by using the second auxiliary coefficient, filtering processing on the fundamental wave feedback signal output by the radio frequency signal feedback module 203, and input an obtained second output signal into the first predistortion coefficient processing submodule 2042.

The first predistortion coefficient processing submodule 2042 is configured to: perform nonlinear modeling according to the second output signal, the fundamental wave feedback signal input into the first predistortion coefficient processing submodule 2042, and the predistortion signal, and train the predistortion coefficient of the predistortion model coefficient training module 204, to obtain the predistortion coefficient.

In this embodiment of the present invention, the auxiliary feedback module 201 extracts an envelope signal from an analog signal, performs sampling processing on the envelope signal, and obtains an envelope feedback signal, thereby implementing real-time feedback of the envelope signal. The auxiliary model coefficient training module 202 trains an auxiliary coefficient by using the envelope feedback signal and a predistortion signal, and transmits an obtained second auxiliary coefficient to the predistortion processing module 205 and the predistortion model coefficient training module 204. The predistortion processing module performs nonlinear modeling by using the second auxiliary coefficient and a predistortion coefficient that is obtained through training by the predistortion model coefficient training module 204, thereby effectively improving accuracy of nonlinear modeling, and performs predistortion processing on an intermediate frequency signal, to obtain a predistortion signal, so that nonlinear demographic rates generated after predistortion processing has been performed on the intermediate frequency signal input into the predistortion processing apparatus and nonlinear demographic rates generated by a power amplifier cancel out each other, linear amplification is performed, and performance of a digital predistortion technology in a case of wideband is improved.

Figure 3:
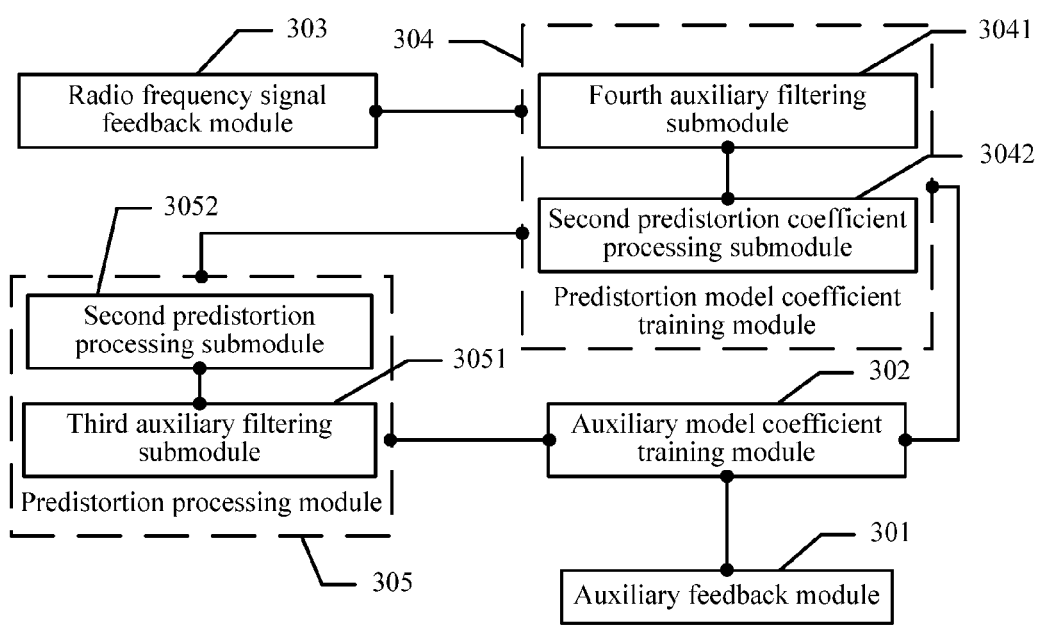
FIG. 3 is another schematic structural diagram of a predistortion processing apparatus according to an embodiment of the present invention.

Referring to FIG. 3, as an example, in this embodiment of the present invention, an auxiliary feedback module feeds back an envelope signal and a harmonic signal. Another embodiment of a predistortion processing apparatus in this embodiment of the present invention includes: an auxiliary feedback module 301, configured to: receive an amplified analog signal, extract a nonlinear distortion signal from the amplified analog signal, perform sampling processing on the nonlinear distortion signal, obtain a feedback signal corresponding to the nonlinear distortion signal, and input the feedback signal into an auxiliary model coefficient training module 302; the auxiliary model coefficient training module 302, configured to: receive the feedback signal and a predistortion signal that is output by a predistortion processing module 305, train an auxiliary coefficient of the auxiliary model coefficient training module 302 according to the feedback signal and the predistortion signal that is output by the predistortion processing module 305, obtain a first auxiliary coefficient after training, and transmit the first auxiliary coefficient obtained through training to the predistortion processing module 305; a radio frequency signal feedback module 303, configured to: receive the amplified analog signal, extract a fundamental wave signal from the amplified analog signal, obtain a fundamental wave feedback signal corresponding to the fundamental wave signal, and input the fundamental wave feedback signal into a predistortion model coefficient training module 304; the predistortion model coefficient training module 304, configured to: receive the fundamental wave feedback signal and the predistortion signal that is output by the predistortion processing module 305, train a predistortion coefficient of the predistortion model coefficient training module 304 according to the fundamental wave feedback signal that is output by the radio frequency signal feedback module and the predistortion signal that is output by the predistortion processing module 305, obtain a predistortion coefficient after training, and transmit the predistortion coefficient obtained through training to the predistortion processing module 305; and the predistortion processing module 305, configured to: perform predistortion processing on an input intermediate frequency signal by performing nonlinear modeling according to the first auxiliary coefficient and the predistortion coefficient, and output a predistortion signal obtained through predistortion processing.

Optionally, based on the foregoing embodiment corresponding to FIG. 3, the nonlinear distortion signal may include an envelope signal and a harmonic signal.

The auxiliary feedback module 301 is specifically configured to: receive the amplified analog signal, extract the envelope signal and the harmonic signal from the amplified analog signal, perform sampling processing on the envelope signal and the harmonic signal, obtain an envelope feedback signal corresponding to the envelope signal, obtain a harmonic feedback signal corresponding to the harmonic signal, and input the envelope feedback signal and the harmonic feedback signal into the auxiliary model coefficient training module 302.

In this embodiment of the present invention, the predistortion processing module 305 includes a third auxiliary filtering submodule 3051 and a second predistortion processing submodule 3052, and the predistortion model coefficient training module 304 includes a fourth auxiliary filtering submodule 3041 and a second predistortion coefficient processing submodule 3042.

Optionally, the auxiliary model coefficient training module 302 is specifically configured to: train the auxiliary coefficient of the auxiliary model coefficient training module 302 by performing modeling by using the predistortion signal, the envelope feedback signal, and the harmonic feedback signal that are input into the auxiliary model coefficient training module 302, to obtain a third auxiliary coefficient after training, and transmit the third auxiliary coefficient to the third auxiliary filtering submodule 3051 and the fourth auxiliary filtering submodule 3041.

Optionally, the third auxiliary filtering submodule 3051 is configured to: construct, according to the intermediate frequency signal input into the predistortion processing module 305, an envelope reference signal and a harmonic reference signal that correspond to the intermediate frequency signal, perform filtering processing on the envelope reference signal and the harmonic reference signal by using the third auxiliary coefficient, and input an obtained third output signal into the second predistortion processing submodule 3052.

The second predistortion processing submodule 3052 is configured to: generate a predistortion vector according to a preset predistortion model by using the third output signal output by the third auxiliary filtering submodule 3051 and a clipping-processed baseband signal that is input into the predistortion processing module 305, multiply the predistortion vector by the predistortion coefficient to obtain the predistortion signal, and output the predistortion signal.

Optionally, the fourth auxiliary filtering submodule 3041 is configured to: perform, by using the third auxiliary coefficient, filtering processing on the fundamental wave feedback signal output by the radio frequency signal feedback module 307, and input an obtained fourth output signal into the second predistortion coefficient processing submodule 3042.

The second predistortion coefficient processing submodule 3042 is configured to: perform nonlinear modeling according to the fourth output signal, a fundamental wave feedback signal input into the second predistortion coefficient processing submodule 3042, and the predistortion signal, and train the predistortion coefficient of the predistortion model coefficient training module 304, to obtain the predistortion coefficient.

It should be noted that the first auxiliary filtering submodule 3051 and the second auxiliary filtering submodule 3041 in this specification have a same structure, and are both digital filters. There are mainly two types of digital filters: an infinite impulse response (IIR, Infinite Impulse Response) digital filter and a finite impulse response (FIR, Finite Impulse Response) digital filter. A specific type of the digital filter in this specification is not limitedly described, provided that the digital filter can implement a function of adaptive filtering.

In this embodiment of the present invention, the auxiliary feedback module 301 extracts an envelope signal and a harmonic signal from an analog signal, performs sampling processing on the envelope signal and the harmonic signal, and obtains an envelope feedback signal and a harmonic feedback signal, thereby implementing real-time feedback of the envelope signal and the harmonic signal. The auxiliary model coefficient training module 302 trains an auxiliary coefficient by using the envelope feedback signal, the harmonic feedback signal, and a predistortion signal, and transmits an obtained third auxiliary coefficient to the predistortion processing module 305 and the predistortion model coefficient training module 304. The predistortion processing module performs nonlinear modeling by using the third auxiliary coefficient and a predistortion coefficient that is obtained through training by the predistortion model coefficient training module 304, thereby effectively improving accuracy of nonlinear modeling, and performs predistortion processing on an intermediate frequency signal, to obtain a predistortion signal, so that nonlinear demographic rates generated after predistortion processing has been performed on the intermediate frequency signal input into the predistortion processing apparatus and nonlinear demographic rates generated by a power amplifier cancel out each other, and performance of a digital predistortion technology in a case of wideband is improved.

Figure 4:
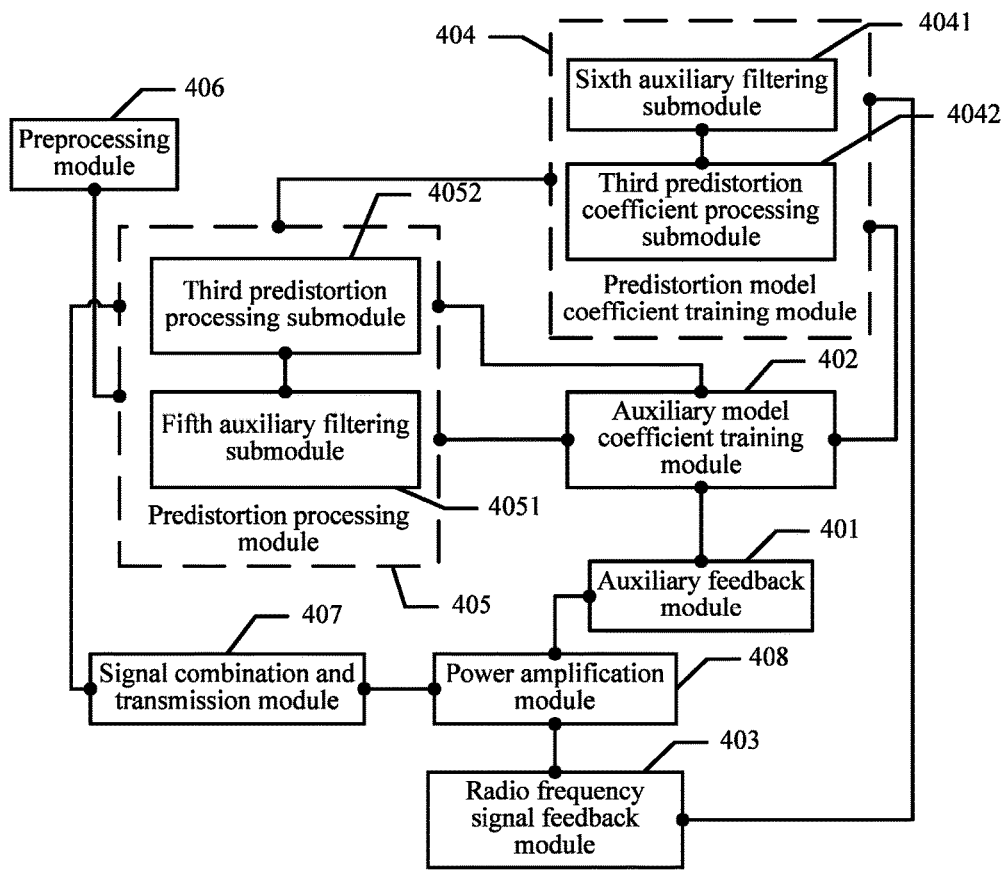
FIG. 4 is another schematic structural diagram of a predistortion processing apparatus according to an embodiment of the present invention.

Referring to FIG. 4, as an example, in this embodiment of the present invention, an auxiliary feedback module feeds back a harmonic signal. Another embodiment of a predistortion processing apparatus in this embodiment of the present invention includes: an auxiliary feedback module 401, configured to: receive an amplified analog signal, extract a nonlinear distortion signal from the amplified analog signal, obtain a feedback signal corresponding to the nonlinear distortion signal, and input the feedback signal into an auxiliary model coefficient training module 402; the auxiliary model coefficient training module 402, configured to: receive the feedback signal and a predistortion signal that is output by a predistortion processing module 405, train an auxiliary coefficient of the auxiliary model coefficient training module 402 according to the feedback signal and the predistortion signal that is output by the predistortion processing module 405, and transmit a first auxiliary coefficient obtained through training to the predistortion processing module 405; a radio frequency signal feedback module 403, configured to: receive the amplified analog signal, extract a fundamental wave signal from the amplified analog signal, obtain a fundamental wave feedback signal corresponding to the fundamental wave signal, and input the fundamental wave feedback signal into a predistortion model coefficient training module 404; the predistortion model coefficient training module 404, configured to: receive the fundamental wave feedback signal and the predistortion signal that is output by the predistortion processing module 405, train a predistortion coefficient of the predistortion model coefficient training module 404 according to the predistortion signal that is output by the predistortion processing module 405 and the fundamental wave feedback signal that is output by the radio frequency signal feedback module 403, and transmit a predistortion coefficient obtained through training to the predistortion processing module 405; and the predistortion processing module 405, configured to: perform predistortion processing on an input intermediate frequency signal by performing nonlinear modeling according to the first auxiliary coefficient and the predistortion coefficient, and output a predistortion signal obtained through predistortion processing.

Optionally, based on the foregoing embodiment corresponding to FIG. 4, the nonlinear distortion signal may include a harmonic signal.

The auxiliary feedback module 401 is specifically configured to: extract the harmonic signal from the amplified analog signal, perform sampling processing on the amplified harmonic signal, obtain a harmonic feedback signal corresponding to the harmonic signal, and input the harmonic feedback signal into the auxiliary model coefficient training module 402.

In this embodiment of the present invention, the predistortion processing module 405 includes a fifth auxiliary filtering submodule 4051 and a third predistortion processing submodule 4052, and the predistortion model coefficient training module 404 includes a sixth auxiliary filtering submodule 4041 and a third predistortion coefficient processing submodule 4042.

The auxiliary model coefficient training module 402 is specifically configured to: train the auxiliary coefficient of the auxiliary model coefficient training module 402 by performing modeling by using the predistortion signal and the harmonic feedback signal that are input into the auxiliary model coefficient training module 402, to obtain a fourth auxiliary coefficient after training, and transmit the fourth auxiliary coefficient to the fifth auxiliary filtering submodule 4051 and the sixth auxiliary filtering submodule 4041.

The fifth auxiliary filtering submodule 4051 is further configured to: construct, according to the intermediate frequency signal input into the predistortion processing module 404, a harmonic reference signal corresponding to the intermediate frequency signal, perform filtering processing on the harmonic reference signal by using the fourth auxiliary coefficient, and input an obtained fifth output signal into the third predistortion processing submodule 4052.

The third predistortion processing submodule 4052 is further configured to: generate a predistortion vector according to a preset predistortion model by using the fifth output signal output by the fifth auxiliary filtering submodule 4051 and a clipping-processed baseband signal that is input into the third predistortion processing submodule 4052, multiply the predistortion vector by the predistortion coefficient to obtain the predistortion signal, and output the predistortion signal.

The sixth auxiliary filtering submodule 4041 is configured to: perform, by using the fourth auxiliary coefficient, filtering processing on the fundamental wave feedback signal output by the radio frequency signal feedback module 403, and input an obtained sixth output signal into a predistortion model processing submodule 4032.

The third predistortion coefficient processing submodule 4042 is configured to: perform nonlinear modeling according to the sixth output signal, a fundamental wave feedback signal input into the third predistortion coefficient processing submodule 4042, and the predistortion signal, and train the predistortion coefficient of the predistortion model coefficient training module 404, to obtain the predistortion coefficient.

Optionally, the apparatus further includes: a preprocessing module 406, configured to: perform digital up-conversion on an input baseband signal, combine all carriers in a same frequency band, perform clipping processing after the combination, and input a baseband signal on which the clipping processing is performed into the predistortion processing module 405, where the baseband signal includes carriers of multiple frequency bands; a signal combination and transmission module 407, configured to: receive the predistortion signal output by the predistortion processing module, convert the predistortion signal output by the predistortion processing module into an analog signal, and output the analog signal to a power amplification module 408; and the power amplification module 408, configured to: amplify the analog signal input into the power amplification module 406, and output the amplified analog signal to the auxiliary feedback module 401 and the radio frequency signal feedback module 407.

In this embodiment of the present invention, the auxiliary feedback module 401 extracts a harmonic signal from an analog signal, and obtains a harmonic feedback signal by using the harmonic signal, thereby implementing real-time feedback of the harmonic signal. The auxiliary model coefficient training module 402 trains an auxiliary coefficient by using an envelope feedback signal and a predistortion signal, and transmits an obtained fourth auxiliary coefficient to the fifth auxiliary filtering submodule 4051 and the sixth auxiliary filtering submodule 4041. The predistortion processing module 405 performs nonlinear modeling by using the fourth auxiliary coefficient and a predistortion coefficient that is obtained through training by the third predistortion coefficient processing submodule 4042, thereby effectively improving accuracy of nonlinear modeling, and performs predistortion processing on an intermediate frequency signal, to obtain a predistortion signal, so that nonlinear demographic rates generated after predistortion processing has been performed on the intermediate frequency signal input into the predistortion processing apparatus and nonlinear demographic rates generated by a power amplifier cancel out each other, and performance of a digital predistortion technology in a case of wideband is improved.

For ease of understanding, the following describes in detail an internal operating procedure of a predistortion processing apparatus in this embodiment of the present invention by using an example in which a frequency band 1 and a frequency band 2 are output signals, that is, intermediate frequency signals (a signal $X_1$ and a signal $X_2$, where $X_1$ corresponds to the frequency band 1, and $X_2$ corresponds to the frequency band 2) of a preprocessing circuit, the frequency band 1 and the frequency band 2 are both baseband signals of carriers including multiple frequency bands, and the auxiliary feedback module feeds back an envelope signal and a harmonic signal at the same time.

Figure 5:
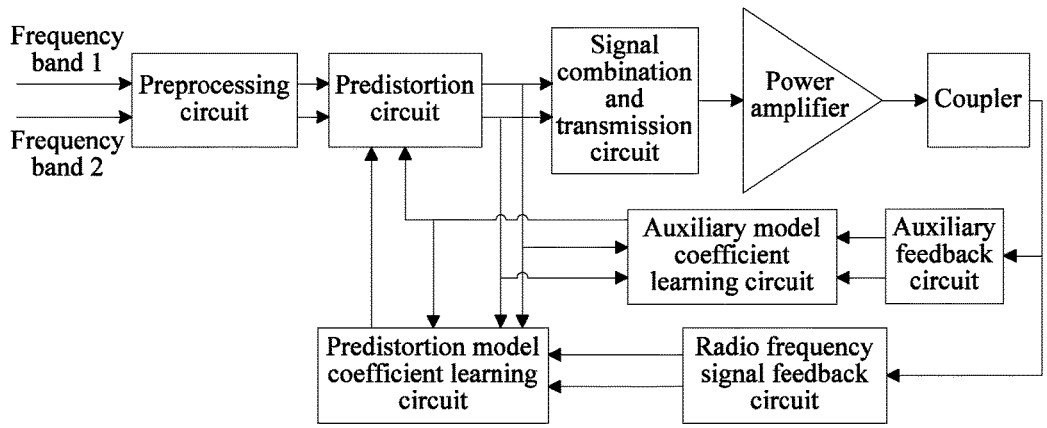
FIG. 5 is a schematic diagram of an internal operation procedure of a predistortion processing apparatus according to an embodiment of the present invention.

It should be noted that a frequency range of the envelope signal is $f_2-f_1-40$ MHz$\leq f_e \leq f_2-f_1+40$ MHz, and frequency ranges of second-harmonic feedback signals corresponding to the frequency band 1 and the frequency band 2 are respectively $2f_1-40$ MHz$\leq f_{h1} \leq 2f_1+40$ MHz and $2f_2-40$ MHz $f_{h2} \leq 2f_2+40$ MHz. Referring to FIG. 4 and FIG. 5, a specific application scenario of a predistortion processing apparatus in the embodiments of the present invention is as follows.

The preprocessing module 406 performs digital up-conversion on an input frequency band 1 and frequency band 2, performs clipping processing after combining all carriers in a same frequency band, to obtain the signal $X_1$ and the signal $X_2$, and inputs the signal $X_1$ and the signal $X_2$ into the predistortion processing module 405.

The signal combination and transmission module 407 converts predistortion signals $y_1$ and $y_2$ that are output by the predistortion processing module 405 into analog signals, and outputs the analog signals to the power amplification module 408.

A specific implementation manner in which the signal combination and transmission module 407 converts $y_1$ and $y_2$ into analog signals is as follows separately performing digital up-conversion on signals of each frequency band in the predistortion signals $y_1$ and $y_2$, combining the signals, and converting the signals into analog signals.

After amplifying the analog signal input into the power amplification module 408, the power amplification module 408 outputs the amplified analog signal to the auxiliary feedback module 401 and the radio frequency signal feedback module 403.

The radio frequency signal feedback module 403 receives the amplified analog signal input by the power amplification module 408, extracts a fundamental wave signal $Z_1$ and a fundamental wave signal $Z_2$ from the amplified analog signal, performs sampling processing on the fundamental wave signals $Z_1$ and $Z_2$, obtains a fundamental wave feedback signal $d_{f1}$ corresponding to the fundamental wave signal $Z_1$ and a fundamental wave feedback signal $d_{f2}$ corresponding to the fundamental wave signal $Z_2$, and inputs the fundamental wave feedback signal $d_{f1}$ and the fundamental wave feedback signal $d_{f2}$ into the predistortion model coefficient training module 404.

A specific implementation manner of obtaining the fundamental wave feedback signals $d_{f1}$ and $d_{f2}$ by using the fundamental wave signals $Z_1$ and $Z_2$ is as follows: respectively performing time delay phase alignment on the two fundamental wave signals $Z_1$ and $Z_2$ and the predistortion signals $y_1$ and $y_2$, to obtain the corresponding fundamental wave feedback signals $d_{f1}$ and $d_{f2}$.

The auxiliary feedback module 401 extracts an envelope signal E, a harmonic signal $F_1$, and a harmonic signal $F_2$ from the amplified analog signal, separately performs sampling processing on E, $F_1$, and $F_2$, obtains an envelope feedback signal $d_e$ corresponding to the envelope signal E, an envelope feedback signal $d_{h1}$ corresponding to $F_1$, an envelope feedback signal $d_{h2}$ corresponding to $F_2$, and inputs $d_e$, $d_{h1}$, and $d_{h2}$ into the auxiliary model coefficient training module 407.

A specific implementation manner of obtaining $d_e$, $d_{h1}$, and $d_{h2}$ by using E and F is as follows separately performing time delay estimation, phase alignment, and power adjustment on digital intermediate feedback signals of the three signals E, $F_1$, and $F_2$, where reference signals corresponding to the three signals E, $F_1$, and $F_2$ are respectively $y_2 y_1^*$, $y_1^2$, $y_2^2$, to separately obtain three adjusted envelope feedback signals and harmonic feedback signals, separately denoted by $d_e$, $d_{h1}$, and $d_{h2}$.

The auxiliary model coefficient training module 402 trains an auxiliary coefficient of the auxiliary model coefficient training module 402 according to $y_1$, $y_2$ that are output by the predistortion processing module 405 and $d_e$, $d_{h1}$, $d_{h2}$, obtains a target auxiliary coefficient after training, and transmits the target auxiliary coefficient to the predistortion processing module 405 and the predistortion model coefficient training module 404.

A specific implementation manner of training the auxiliary coefficient of the auxiliary model coefficient training module 402 by using $d_e$, $d_{h1}$, $d_{h2}$, $y_1$, and $y_2$ may be separately performing modeling on $d_e$, $d_{h1}$, and $d_{h2}$, and separately performing fitting on the three reference signals $y_2 y_1^*$, $y_1^2$, $y_2^2$, denoted as: $y_2 y_1^* = F_1(d_e)$, $y_1^2 = F_2(d_{h1})$, and $y_2^2 = F_3(d_{h2})$. $F_i(\square)$, i=1, 2, 3 is a modeling manner. Depending on accuracy and complexity of fitting of the model, the modeling manner may be linear modeling or may be nonlinear modeling. When the model is a linear model, specific expressions are as follows:

$$y_2 y_1^*(n) = \sum_{m=0}^{M_e} w_{e,m} d_e(n-m),$$

$$y_1^2(n) = \sum_{m=0}^{M_{h1}} w_{h1,m} d_{h1}(n-m), \text{ and}$$

$$y_2^2(n) = \sum_{m=0}^{M_{h2}} w_{h2,m} d_{h2}(n-m),$$

where $w_e$, $w_{h1}$, $w_{h2}$ are respectively second-harmonic filtering coefficients, that is, target auxiliary coefficients, of the envelope signal, the frequency band 1, and the frequency band 2. Three systems of linear equations are constructed by using N consecutive sampling points, the least square method or a similar adaptive algorithm such as the LMS algorithm or the RLS algorithm is used, to calculate the auxiliary coefficients $w_e$, $w_{h1}$, $w_{h2}$, and the target auxiliary coefficients are transmitted to the fifth auxiliary filtering submodule 4051 in the predistortion processing module 405 and the sixth auxiliary filtering submodule 4041 in the predistortion model coefficient training module 404. The target auxiliary coefficients are used for auxiliary filtering.

It should be noted that nonlinear modeling, for example, memory polynomial modeling, may also be used for the model in this embodiment. A specific modeling manner is not limited in this specification.

The predistortion model coefficient training module 404 trains the predistortion coefficient of the predistortion model coefficient training module 404 according to fundamental wave feedback signals $d_{f1}$ and $d_{f2}$ that are output by the radio frequency signal feedback module, $y_1$, and $y_2$, obtains a target predistortion coefficient after training, and transmits the predistortion coefficient obtained through training to the predistortion processing module 405.

A specific implementation manner of training the predistortion coefficient by using $d_{f1}$ and $d_{f2}$ is as follows: constructing, by using the fundamental wave feedback signals $d_{f1}$ and $d_{f2}$, an envelope reference signal of an envelope signal and harmonic reference signals of second-harmonic signals corresponding to the frequency bands 1 and 2, which are respectively $d_{f2}d_{f1}^*$, $d_{f1}^2$, $d_{f2}^2$, and inputting the three signals into the sixth auxiliary filtering submodule 4041, where three obtained output signals are denoted by $p_e$, $p_{f1}$, $p_{f2}$, and the three output signals respectively correspond to $d_{f2}d_{f1}^*$, $d_{f1}^2$, $d_{f2}^2$. For parts in which the sixth auxiliary filtering submodule appears, the details are not described again.

Functions completed by the sixth auxiliary filtering submodule 4041 may be described by using the following formulas:

$$p_e(n) = \sum_{m=0}^{M_e} w_{e,m} d_{f2}(n-m) d_{f1}^*(n-m),$$

$$p_{f1}(n) = \sum_{m=0}^{M_{h1}} w_{h1,m} d_{f1}^2(n-m), \text{ and}$$

$$p_{f2}(n) = \sum_{m=0}^{M_{h2}} w_{h2,m} d_{f2}^2(n-m).$$

The third predistortion processing submodule 4052 in the predistortion processing module 405 then performs nonlinear modeling by using the output signals $p_e$, $p_{f1}$, $p_{f2}$ of the sixth auxiliary filtering submodule 4041 and the fundamental wave feedback signals $d_{f1}$ and $d_{f2}$, and performs fitting on output signals $y_1$, $y_2$ of the predistortion circuit. For ease of description, in a case of considering only a three-order nonlinear distortion, specific nonlinear models are as follows:

$$y_1(n) = \sum_{m=0}^{M} (w_{m,1}^1 d_{f1}(n-m) + w_{m,2}^1 d_{f1}(n-m)|d_{f1}(n-m)|^2 +$$

$$w_{m,3}^1 p_{f1}(n-m) d_{f1}^*(n-m)) +$$

$$\sum_{m=0}^{M} (w_{m,4}^1 d_{f1}(n-m)|d_{f2}(n-m)|^2 + w_{m,5}^1 d_{f2}(n-m) p_e^*(n-m)),$$

and $$y_2(n) = \sum_{m=0}^{M} (w_{m,1}^2 d_{f2}(n-m) + w_{m,2}^2 d_{f2}(n-m)|d_{f2}(n-m)|^2 +$$

$$w_{m,3}^2 p_{f2}(n-m) d_{f2}^*(n-m)) +$$

$$\sum_{m=0}^{M} (w_{m,4}^2 d_{f2}(n-m)|d_{f1}(n-m)|^2 + w_{m,5}^2 d_{f1}(n-m) p_e(n-m)),$$

where $w_{m,j}^i$ indicates a predistortion coefficient with a memory depth of m in the $j^{th}$ part of the $i^{th}$ frequency band. In this embodiment, i=1, 2, 3, 4, or 5. Therefore, expressions of the predistortion coefficients $w^1$, $w^2$ of the frequency band 1 and the frequency band 2 are:

$$w^1(w_{0,1}^1, w_{1,1}^1, \ldots, w_{M,1}^1, w_{1,2}^1, \ldots, w_{M,2}^1, \ldots, w_{1,5}^1, \ldots, w_{M,5}^1)$$

$$w^2(w_{0,1}^2, w_{1,1}^2, \ldots, w_{M,1}^2, w_{1,2}^2, \ldots, w_{M,2}^2, \ldots, w_{1,5}^2, \ldots, w_{M,5}^2).$$

Two systems of linear equations are constructed by using N consecutive sampling points, the least square method or another adaptive algorithm such as the LMS or the RLS is used, to solve the predistortion coefficients $w^1$, $w^2$ of the frequency band 1 and the frequency band 2, and the predistortion coefficients are transmitted to the predistortion processing module 405, for predistortion processing.

The predistortion processing module 405 performs nonlinear modeling according to the target auxiliary coefficients and the predistortion coefficients, performs predistortion processing on an input intermediate frequency signal, and outputs a predistortion signal obtained through predistortion processing.

A specific implementation manner of performing nonlinear modeling by using the target auxiliary coefficients $w_e$, $w_{h1}$, and $w_{h2}$ and the predistortion coefficients is as follows: the third predistortion processing submodule 4052 constructs, by using digital intermediate frequency signals $x_1$, $x_2$ of the frequency band 1 and the frequency band 2, a corresponding reference signal of the envelope signal and reference signals of the second-harmonic signal, which are respectively as follows: $x_2 x_1^*$, $x_1^2$, $x_2^2$, inputs the three signals into the fifth auxiliary filtering submodule 4051, respectively obtains three output signals, denoted by $q_e$, $q_{f1}$, and $q_{f2}$. Functions completed by the fifth auxiliary filtering submodule 4051 may be described by using the following formulas:

$$q_e(n) = \sum_{m=0}^{M_e} w_{e,m} x_2(n-m) x_1^*(n-m),$$

$$q_{f1}(n) = \sum_{m=0}^{M_{h1}} w_{h1,m} x_1^2(n-m), \text{ and}$$

$$q_{f2}(n) = \sum_{m=0}^{M_{h2}} w_{h2,m} x_2^2(n-m).$$

The third predistortion processing submodule 4052 performs nonlinear modeling by using signals ($q_e$, $q_{f1}$, and $q_{f2}$) that are output by the fifth auxiliary filtering submodule 4051 and the signals $x_1$, $x_2$ of the frequency band 1 and the frequency band 2, multiplies the signals by the predistortion coefficients $w^1$, $w^2$ separately, and performs summation, to obtain output signals $y_1$, $y_2$ of the predistortion processing module 405. Functions implemented by the predistortion processing module 405 may be expressed by using the following two formulas:

$$y_1(n) = \sum_{m=0}^{M} (w_{m,1}^1 x_1(n-m) +$$

$$w_{m,2}^1 x_1(n-m)|x_1(n-m)|^2 + w_{m,3}^1 q_{f1}(n-m) x_1^*(n-m)) +$$

$$\sum_{m=0}^{M} (w_{m,4}^1 x_1(n-m)|x_2(n-m)|^2 + w_{m,5}^1 x_2(n-m) q_e^*(n-m)), \text{ and}$$

$$y_2(n) = \sum_{m=0}^{M} (w_{m,1}^2 x_2(n-m) + w_{m,2}^2 x_2(n-m)|x_2(n-m)|^2 +$$

$$w_{m,3}^2 q_{f2}(n-m) x_2^*(n-m)) +$$

$$\sum_{m=0}^{M} (w_{m,4}^2 x_2(n-m)|x_1(n-m)|^2 + w_{m,5}^2 x_1(n-m) q_e(n-m)).$$

The predistortion signals $y_1$, $y_2$ are input into the signal combination and transmission module 407, so that the signal combination and transmission module 407 converts $y_1$, $y_2$ into analog signals, and outputs the analog signals to the power amplification module 408.

In a process of training the predistortion coefficient of the predistortion model coefficient training module 404, the following determining may be performed by using convergence: ACLR (Adjacent Channel Leakage Ratio, adjacent channel leakage ratio) performance of the fundamental wave feedback signals $d_{f1}$ and $d_{f2}$ may be detected, or a normalized mean squared error NMSE (Normalized Mean Squared Error, normalized mean squared error), which is used for representing a calculation convergence speed and calculation accuracy, of the fundamental wave feedback signals $d_{f1}$ and $d_{f2}$ and the signals $x_1$, $x_2$ of the frequency band 1 and the frequency band 2 may be detected, where an expression of the NMSE is:

$$NMSE = 10\log_{10} \frac{\sum_{n=0}^{N}(|z(n) - z(\hat{n})|^2)}{\sum_{n=1}^{N}(|z(n)|^2)},$$

to determine whether DPD is converged. If DPD is converged, the procedure ends. If DPD is not converged, the steps of training, by the auxiliary model coefficient training module 402, the auxiliary coefficient, training, by the predistortion model coefficient training module 404, the predistortion coefficient, and performing, by the predistortion processing module 405, coefficient modeling according to the coefficients are repeated, until convergence occurs.

It should be noted that in this specification, the predistortion processing module may be specifically a predistortion circuit. The fifth auxiliary filtering submodule and the sixth auxiliary filtering submodule may be specifically auxiliary filtering circuits. The power amplification module may be a power amplifier. The auxiliary feedback module may be specifically an auxiliary feedback circuit. The predistortion model coefficient training module may be a predistortion model coefficient learning circuit. The auxiliary model coefficient training module may be an auxiliary model coefficient learning circuit. The signal combination and transmission module may be a signal combination and transmission circuit. The radio frequency signal feedback module may be a radio frequency signal feedback circuit. Specifically, in an actual application, related circuits are selected as required, to implement the objective of the solution in this embodiment of the present invention. For details, refer to a flowchart of signal transmission shown in FIG. 5.

In this embodiment of the present invention, the auxiliary feedback module 401 extracts an envelope signal and a harmonic signal from an analog signal, performs sampling processing on the envelope signal and the harmonic signal, and obtains an envelope feedback signal and a harmonic feedback signal, thereby implementing real-time feedback of the envelope signal and the harmonic signal. The auxiliary model coefficient training module 402 trains an auxiliary coefficient by using the envelope feedback signal, the harmonic feedback signal, and a predistortion signal, and transmits an obtained target auxiliary coefficient to the predistortion processing module 405 and the predistortion model coefficient training module 404. The predistortion processing module 405 performs nonlinear modeling by using the target auxiliary coefficient and a predistortion coefficient that is obtained through training by the predistortion model coefficient training module 404, thereby effectively improving accuracy of nonlinear modeling, and performs predistortion processing on an intermediate frequency signal, to obtain a predistortion signal, so that nonlinear demographic rates generated after predistortion processing has been performed on the intermediate frequency signal input into the predistortion processing apparatus and nonlinear demographic rates generated by the power amplification module 408 cancel out each other, and performance of a digital predistortion technology in a case of wideband is improved.

Figure 6:
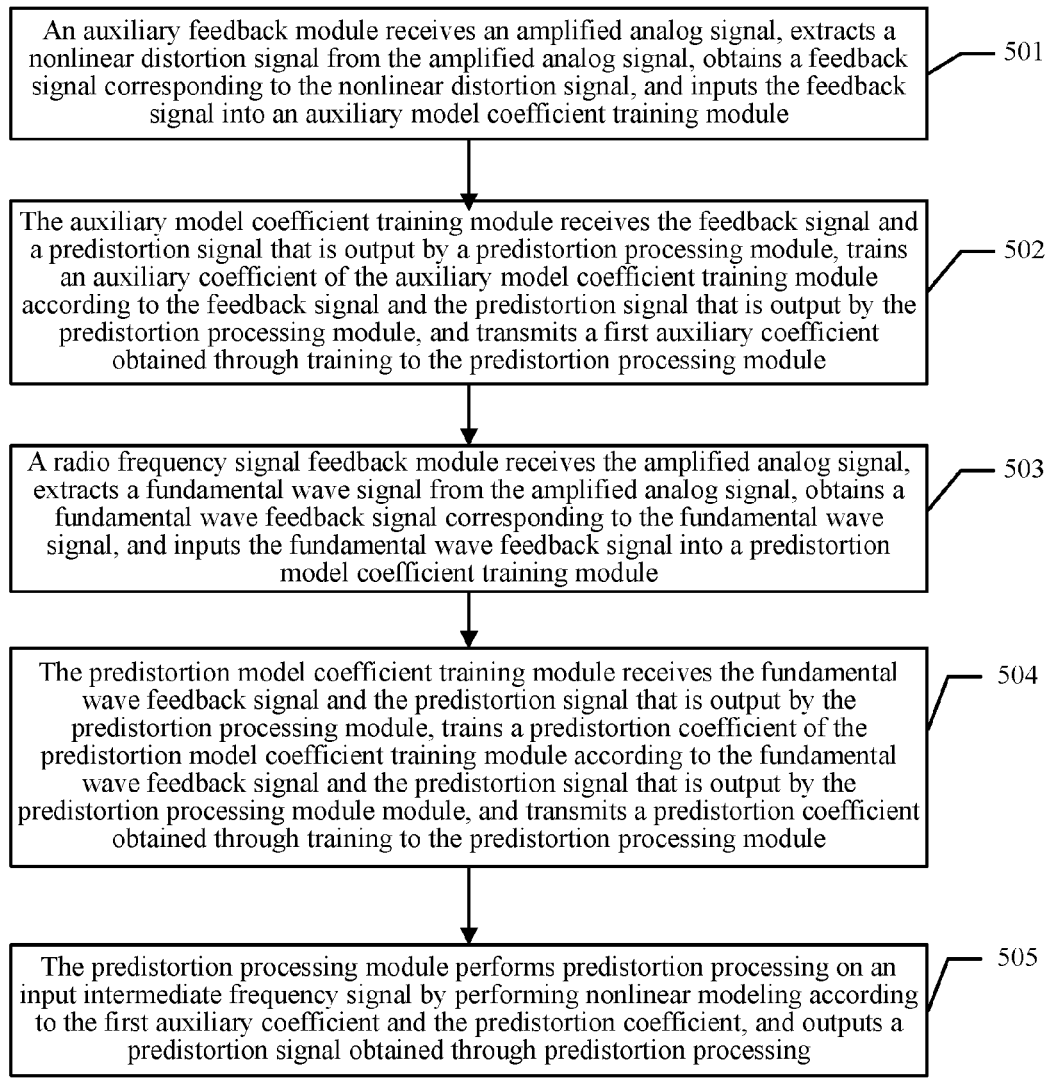
FIG. 6 is a schematic diagram of an embodiment of a predistortion processing method according to an embodiment of the present invention.

A predistortion processing apparatus according to an embodiment of the present invention is described in detail above. The following describes a predistortion processing method according to an embodiment of the present invention. Referring to FIG. 6, an embodiment of a predistortion processing method in an embodiment of the present invention includes the following steps.

501. An auxiliary feedback module receives an amplified analog signal, extracts a nonlinear distortion signal from the amplified analog signal, obtains a feedback signal corresponding to the nonlinear distortion signal, and inputs the feedback signal into an auxiliary model coefficient training module.

After the nonlinear distortion signal is extracted from the analog signal, sampling processing is performed on the nonlinear distortion signal, and the feedback signal corresponding to the nonlinear distortion signal may be obtained. A specific implementation manner of sampling processing may be specifically as follows.

First, the nonlinear distortion signal is converted into a digital signal. An ADC (Analog to Digital conversion, analog-to-digital conversion) sampling method may then be used, to perform digital down-conversion and time delay phase alignment on the digital signal. Specifically, a down-converter may be used to perform down-conversion on the digital signal, and a phase shift may be used to perform time delay phase alignment on the digital signal, so that a feedback signal corresponding to at least one frequency band can be obtained. A specific manner of sampling processing is not limited in this specification. The nonlinear distortion signal may be single-band, or dual-band, or may include different frequency bands, or the like. Specific components are not limited in this specification.

502. The auxiliary model coefficient training module receives the feedback signal and a predistortion signal that is output by a predistortion processing module, trains an auxiliary coefficient of the auxiliary model coefficient training module according to the feedback signal and the predistortion signal that is output by the predistortion processing module, and transmits a first auxiliary coefficient obtained through training to the predistortion processing module.

503. A radio frequency signal feedback module receives the amplified analog signal, extracts a fundamental wave signal from the amplified analog signal, obtains a fundamental wave feedback signal corresponding to the fundamental wave signal, and inputs the fundamental wave feedback signal into a predistortion model coefficient training module.

504. The predistortion model coefficient training module receives the fundamental wave feedback signal and the predistortion signal that is output by the predistortion processing module, trains a predistortion coefficient of the predistortion model coefficient training module according to the fundamental wave feedback signal and the predistortion signal that is output by the predistortion processing module, and transmits a predistortion coefficient obtained through training to the predistortion processing module.

505. The predistortion processing module performs predistortion processing on an input intermediate frequency signal by performing nonlinear modeling according to the first auxiliary coefficient and the predistortion coefficient, and outputs a predistortion signal obtained through predistortion processing.

It should be noted that in this specification, a transmission manner in which the auxiliary model coefficient training module transmits the auxiliary coefficient to the predistortion processing module and the predistortion model coefficient training module and the predistortion model coefficient training module transmits the predistortion coefficient to the predistortion processing module may be implemented as follows.

When data transmission is implemented in an FPGA (field programmable gate array), data in a register that corresponds to a circuit A (the register is configured to store a coefficient in the circuit A) is replicated to a register that corresponds to a circuit B (the register is configured to store a coefficient in the circuit B). Only data transmission is completed. Certainly, coefficient replication may further be completed by changing an address of a register the circuit B is to read. A specific implementation manner is not limited in this specification.

In this embodiment of the present invention, an auxiliary feedback module extracts a nonlinear distortion signal from an analog signal, performs sampling processing on the nonlinear distortion signal, and obtains a feedback signal corresponding to the nonlinear distortion signal, thereby implementing real-time feedback of the nonlinear distortion signal. An auxiliary model coefficient training module trains an auxiliary coefficient by using the feedback signal output by the auxiliary feedback module and a predistortion signal output by the predistortion processing module, and transmits an obtained first auxiliary coefficient to the predistortion processing module and a predistortion model coefficient training module. The predistortion processing module performs nonlinear modeling by using the first auxiliary coefficient and a predistortion coefficient that is obtained through training by the predistortion model coefficient training module, thereby effectively improving accuracy of nonlinear modeling, and performs predistortion processing on an intermediate frequency signal, to obtain a predistortion signal, so that nonlinear demographic rates generated after predistortion processing has been performed on the intermediate frequency signal input into the predistortion processing apparatus and nonlinear demographic rates generated by a power amplifier cancel out each other, linear amplification is performed, and performance of a digital predistortion technology in a case of wideband is improved.

Optionally, based on the foregoing embodiment corresponding to FIG. 5, in a first optional embodiment of the predistortion processing method provided in this embodiment of the present invention, the nonlinear distortion signal includes an envelope signal, the predistortion processing module includes a first auxiliary filtering submodule and a first predistortion processing submodule, and the predistortion model coefficient training module includes a second auxiliary filtering submodule and a first predistortion coefficient processing submodule.

The auxiliary feedback module extracts the envelope signal from the amplified analog signal, performs sampling processing on the envelope signal, obtains an envelope feedback signal corresponding to the envelope signal, and inputs the envelope feedback signal into the auxiliary model coefficient training module.

The auxiliary model coefficient training module trains the auxiliary coefficient of the auxiliary model coefficient training module by performing modeling by using the predistortion signal and the envelope feedback signal that are input into the auxiliary model coefficient training module, to obtain a second auxiliary coefficient after training, and transmits the second auxiliary coefficient to the first auxiliary filtering submodule and the second auxiliary filtering submodule.

The first auxiliary filtering submodule constructs, according to the intermediate frequency signal input into the predistortion processing module, an envelope reference signal corresponding to the intermediate frequency signal, performs filtering processing on the envelope reference signal by using the second auxiliary coefficient, and inputs an obtained first output signal into the first predistortion processing submodule.

The first predistortion processing submodule generates a predistortion vector according to a preset predistortion model by using the first output signal output by the first auxiliary filtering submodule and a clipping-processed baseband signal that is input into the first predistortion processing submodule, multiplies the predistortion vector by the predistortion coefficient to obtain the predistortion signal, and outputs the predistortion signal.

The second auxiliary filtering submodule performs, by using the second auxiliary coefficient, filtering processing on the fundamental wave feedback signal output by the radio frequency signal feedback module, and inputs an obtained second output signal into a predistortion model processing submodule.

The first predistortion coefficient processing submodule performs nonlinear modeling according to the second output signal, the fundamental wave feedback signal input into the first predistortion coefficient processing submodule, and the predistortion signal, and trains the predistortion coefficient of the predistortion model coefficient training module, to obtain the predistortion coefficient.

Optionally, based on the foregoing embodiment corresponding to FIG. 5, in a second optional embodiment of the predistortion processing method provided in this embodiment of the present invention, the nonlinear distortion signal includes an envelope signal and a harmonic signal, the predistortion processing module includes a third auxiliary filtering submodule and a second predistortion processing submodule, and the predistortion model coefficient training module includes a fourth auxiliary filtering submodule and a second predistortion coefficient processing submodule.

The auxiliary feedback module extracts the envelope signal and the harmonic signal from the analog signal, performs sampling processing on the envelope signal and the harmonic signal, obtains an envelope feedback signal corresponding to the envelope signal and a harmonic feedback signal corresponding to the harmonic signal, and inputs the envelope feedback signal and the harmonic feedback signal into the auxiliary model coefficient training module.

The auxiliary model coefficient training module trains the auxiliary coefficient by using the predistortion signal, the envelope feedback signal, and the harmonic feedback signal that are input into the auxiliary model coefficient training module, obtains a third auxiliary coefficient after training, and transmits the third auxiliary coefficient to the third auxiliary filtering submodule and the fourth auxiliary filtering submodule.

The third auxiliary filtering submodule constructs, according to the intermediate frequency signal input into the predistortion processing module, an envelope reference signal and a harmonic reference signal that correspond to the intermediate frequency signal, performs filtering processing on the envelope reference signal and the harmonic reference signal by using the third auxiliary coefficient, and inputs an obtained third output signal into the second predistortion processing submodule.

The second predistortion processing submodule generates a predistortion vector according to a preset predistortion model by using the third output signal output by the third auxiliary filtering submodule and a clipping-processed baseband signal that is input into the second predistortion processing submodule, multiplies the predistortion vector by the predistortion coefficient to obtain the predistortion signal, and outputs the predistortion signal.

The fourth auxiliary filtering submodule performs, by using the second auxiliary coefficient, filtering processing on the fundamental wave feedback signal output by the radio frequency signal feedback module, and inputs an obtained fourth output signal into the second predistortion coefficient processing submodule.

The second predistortion coefficient processing submodule performs nonlinear modeling according to the fourth output signal, a fundamental wave feedback signal input into the second predistortion coefficient processing submodule, and the predistortion signal, and trains the predistortion coefficient of the predistortion model coefficient training module, to obtain the predistortion coefficient.

Optionally, based on the foregoing embodiment corresponding to FIG. 5, in a third optional embodiment of the predistortion processing method provided in this embodiment of the present invention, the nonlinear distortion signal is a harmonic signal, the predistortion processing module includes a third auxiliary filtering submodule and a third predistortion processing submodule, and the predistortion model coefficient training module includes a sixth auxiliary filtering submodule and a third predistortion coefficient processing submodule.

The auxiliary feedback module extracts a harmonic signal from the analog signal, performs sampling processing on the harmonic signal, obtains a harmonic feedback signal corresponding to the harmonic signal, and inputs the harmonic feedback signal into the auxiliary model coefficient training module.

The auxiliary model coefficient training module trains the auxiliary coefficient by using the predistortion signal and the harmonic feedback signal that are input into the auxiliary model coefficient training module, obtains a fourth auxiliary coefficient after training, and transmits the fourth auxiliary coefficient to the fifth auxiliary filtering submodule and the sixth auxiliary filtering submodule.

The fifth auxiliary filtering submodule constructs, according to the intermediate frequency signal input into the predistortion processing module, a harmonic reference signal corresponding to the intermediate frequency signal, performs filtering processing on the harmonic reference signal by using the fourth auxiliary coefficient, and inputs an obtained fifth output signal into the third predistortion processing submodule.

The third predistortion processing submodule generates a predistortion vector according to a preset predistortion model by using the fifth output signal output by the fifth auxiliary filtering submodule and a clipping-processed baseband signal that is input into the third predistortion processing submodule, multiplies the predistortion vector by the predistortion coefficient to obtain the predistortion signal, and outputs the predistortion signal.

The sixth auxiliary filtering submodule performs, by using the second auxiliary coefficient, filtering processing on the fundamental wave feedback signal output by the radio frequency signal feedback module, and inputs an obtained sixth output signal into a predistortion model processing submodule.

The third predistortion coefficient processing submodule performs nonlinear modeling according to the sixth output signal, a fundamental wave feedback signal input into the third predistortion coefficient processing submodule, and the predistortion signal, and trains the predistortion coefficient of the predistortion model coefficient training module, to obtain the predistortion coefficient.

Optionally, based on the embodiment corresponding to FIG. 5 of the foregoing predistortion processing method or any optional embodiment, in a fourth optional embodiment of the predistortion processing method provided in the embodiments of the present invention, a preprocessing module performs digital up-conversion on a baseband signal input into the preprocessing module, combines all carriers in a same frequency band, performs clipping processing after the combination, and inputs a baseband signal on which the clipping processing is performed into the predistortion processing module, where the baseband signal includes carriers of multiple frequency bands.

A signal combination and transmission module receives the predistortion signal output by the predistortion processing module, converts the predistortion signal output by the predistortion processing module into an analog signal, and outputs the analog signal to a power amplification module.

The power amplification module amplifies the analog signal input into the power amplification module, and outputs the amplified analog signal to the auxiliary feedback module and the radio frequency signal feedback module.

In this embodiment of the present invention, the auxiliary feedback module feeds back at least one of an envelope signal or a harmonic signal, and converts the envelope signal into an envelope feedback signal or converts the harmonic signal into a harmonic feedback signal. The auxiliary model coefficient training module performs nonlinear modeling by using the envelope feedback signal or the harmonic feedback signal, and transmits an auxiliary coefficient obtained through training to the predistortion model coefficient training module and the predistortion processing module, so that the predistortion model coefficient training module performs modeling by using the auxiliary coefficient and a fundamental wave feedback signal, and transmits a predistortion coefficient obtained through training to the predistortion processing module, to improve accuracy of predistortion modeling, so that the predistortion processing module performs predistortion processing on an intermediate frequency signal by using the predistortion coefficient, and nonlinear demographic rates generated by the intermediate frequency signal and nonlinear demographic rates generated by a power amplifier cancel out each other, thereby improving performance of a digital predistortion technology in a case of wideband.

It should be noted that as long as the predistortion coefficient obtained through training by the predistortion model coefficient training module falls within a first preset threshold range, the predistortion processing module can always use the predistortion coefficient without needing to update the predistortion coefficient in real time. The auxiliary model coefficient training module may perform training on the auxiliary coefficient periodically or non-periodically.

The auxiliary coefficient may not be updated provided that the auxiliary coefficient falls within a second preset threshold range, or the auxiliary coefficient may be updated. A period for training the predistortion coefficient by the predistortion model coefficient training module and training the auxiliary coefficient by the auxiliary model coefficient training module is determined according to a circuit design and a customer need. A specific implementation manner is not limited in this specification.

Specific embodiments are used in this specification to describe the principle and implementation manners of the present invention. The foregoing embodiments are merely intended to help understand the method and core idea of the present invention. In addition, with respect to the implementation manners and the application scope, modifications may be made by a person of ordinary skill in the art according to the idea of the present invention. Therefore, the specification shall not be construed as a limitation on the present invention. The terms used in the embodiments of the present invention are merely for the purpose of illustrating specific embodiments, and are not intended to limit the present invention. The terms "a", "said" and "the" of singular forms used in the embodiments and the appended claims of the present invention are also intended to include plural forms, unless otherwise specified in the context clearly. It should be further understood that the term "at least one of a or b" used in this specification refers to any possible case in which only a is included, or only b is included, or both a and b are included.

The foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A predistortion processing apparatus comprising:
   an auxiliary feedback circuit, configured to:
      receive an amplified analog signal,
      extract a nonlinear distortion signal from the amplified analog signal,
      obtain a feedback signal corresponding to the nonlinear distortion signal, and
      input the feedback signal into an auxiliary model coefficient training circuit;
   the auxiliary model coefficient training circuit being configured to:
      receive the feedback signal and a predistortion signal that is output by a predistortion processing circuit,
      train an auxiliary coefficient of the auxiliary model coefficient training circuit according to the feedback signal and the predistortion signal that is output by the predistortion processing circuit, and
      transmit a first auxiliary coefficient obtained through training to the predistortion processing circuit;
   a radio frequency signal feedback circuit configured to:
      receive the amplified analog signal, extract a fundamental wave signal from the amplified analog signal,
      obtain a fundamental wave feedback signal corresponding to the fundamental wave signal, and
      input the fundamental wave feedback signal into a predistortion model coefficient training circuit;
   the predistortion model coefficient training circuit configured to:
      receive the fundamental wave feedback signal and the predistortion signal that is output by the predistortion processing circuit,
      train a predistortion coefficient of the predistortion model coefficient training circuit according to the fundamental wave feedback signal and the predistortion signal that is output by the predistortion processing circuit, and
      transmit a predistortion coefficient obtained through training to the predistortion processing circuit; and
   the predistortion processing circuit configured to perform predistortion processing on an input intermediate frequency signal by performing nonlinear modeling according to the first auxiliary coefficient and the predistortion coefficient, and output a predistortion signal obtained through predistortion processing.

2. The apparatus according to claim 1, wherein the nonlinear distortion signal comprises an envelope signal, and the auxiliary feedback circuit is configured to: receive the amplified analog signal, extract the envelope signal from the amplified analog signal, perform sampling processing on the envelope signal, obtain an envelope feedback signal corresponding to the envelope signal, and input the envelope feedback signal into the auxiliary model coefficient training circuit.

3. The apparatus according to claim 2, wherein the predistortion processing circuit comprises a first auxiliary filtering subcircuit and a first predistortion processing subcircuit, and the predistortion model coefficient training circuit comprises a second auxiliary filtering subcircuit and a first predistortion coefficient processing subcircuit; and
   the auxiliary model coefficient training circuit is configured to:
      train the auxiliary coefficient of the auxiliary model coefficient training circuit by performing modeling by using the predistortion signal and the envelope feedback signal that are input into the auxiliary model coefficient training circuit,
      obtain a second auxiliary coefficient after the training, and
      transmit the second auxiliary coefficient to the first auxiliary filtering subcircuit and the second auxiliary filtering subcircuit.

4. The apparatus according to claim 3, wherein the first auxiliary filtering subcircuit is configured to:
   construct, according to the intermediate frequency signal input into the predistortion processing circuit, an envelope reference signal corresponding to the intermediate frequency signal,
   perform filtering processing on the envelope reference signal by using the second auxiliary coefficient, and
   input an obtained first output signal into the first predistortion processing subcircuit;
   the first predistortion processing subcircuit is configured to:
   generate a predistortion vector according to a preset predistortion model by using the first output signal output by the first auxiliary filtering subcircuit and a clipping-processed baseband signal that is input into the first predistortion processing subcircuit,
   multiply the predistortion vector by the predistortion coefficient to obtain the predistortion signal, and
   output the predistortion signal;

the second auxiliary filtering subcircuit is configured to:
perform, by using the second auxiliary coefficient, filtering processing on the fundamental wave feedback signal output by the radio frequency signal feedback circuit, and
input an obtained second output signal into the first predistortion coefficient processing subcircuit; and
the first predistortion coefficient processing subcircuit is configured to:
perform nonlinear modeling according to the second output signal, the fundamental wave feedback signal input into the first predistortion coefficient processing subcircuit, and the predistortion signal,
train the predistortion coefficient of the predistortion model coefficient training circuit, and
obtain the predistortion coefficient.

5. The apparatus according to claim 1, wherein the nonlinear distortion signal comprises an envelope signal and a harmonic signal, and the auxiliary feedback circuit is configured to:
receive the amplified analog signal, extract the envelope signal and the harmonic signal from the amplified analog signal,
perform sampling processing on the envelope signal and the harmonic signal,
obtain an envelope feedback signal corresponding to the envelope signal and a harmonic feedback signal corresponding to the harmonic signal, and
input the envelope feedback signal and the harmonic feedback signal into the auxiliary model coefficient training circuit.

6. The apparatus according to claim 5, wherein the predistortion processing circuit comprises a third auxiliary filtering subcircuit and a second predistortion processing subcircuit, and the predistortion model coefficient training circuit comprises a fourth auxiliary filtering subcircuit and a second predistortion coefficient processing subcircuit; and
the auxiliary model coefficient training circuit is configured to:
train the auxiliary coefficient of the auxiliary model coefficient training circuit by performing modeling by using the predistortion signal, the envelope feedback signal, and the harmonic feedback signal that are input into the auxiliary model coefficient training circuit,
obtain a third auxiliary coefficient after training, and transmit the third auxiliary coefficient to the third auxiliary filtering subcircuit and the fourth auxiliary filtering subcircuit.

7. The apparatus according to claim 6, wherein the third auxiliary filtering subcircuit is configured to:
construct, according to the intermediate frequency signal input into the predistortion processing circuit, an envelope reference signal and a harmonic reference signal that correspond to the intermediate frequency signal,
perform filtering processing on the envelope reference signal and the harmonic reference signal by using the third auxiliary coefficient, and
input an obtained third output signal into the second predistortion processing subcircuit;
the second predistortion processing subcircuit is configured to:
generate a predistortion vector according to a preset predistortion model by using the third output signal output by the third auxiliary filtering subcircuit and a clipping-processed baseband signal that is input into the predistortion processing subcircuit,
multiply the predistortion vector by the predistortion coefficient to obtain the predistortion signal, and output the predistortion signal;
the fourth auxiliary filtering subcircuit is configured to:
perform, by using the third auxiliary coefficient, filtering processing on the fundamental wave feedback signal output by the radio frequency signal feedback circuit, and
input an obtained fourth output signal into the second predistortion coefficient processing subcircuit; and
the second predistortion coefficient processing subcircuit is configured to:
perform nonlinear modeling according to the fourth output signal, a fundamental wave feedback signal input into the second predistortion coefficient processing subcircuit, and the predistortion signal,
train the predistortion coefficient of the predistortion model coefficient training circuit, and
obtain the predistortion coefficient.

8. The apparatus according to claim 1, wherein the nonlinear distortion signal comprises a harmonic signal, and the auxiliary feedback circuit is configured to: extract the harmonic signal from the amplified analog signal, perform sampling processing on the harmonic signal, obtain a harmonic feedback signal corresponding to the harmonic signal, and input the harmonic feedback signal into the auxiliary model coefficient training circuit.

9. The apparatus according to claim 8, wherein the predistortion processing circuit comprises a fifth auxiliary filtering subcircuit and a third predistortion processing subcircuit, and the predistortion model coefficient training circuit comprises a sixth auxiliary filtering subcircuit and a third predistortion coefficient processing subcircuit, and
the auxiliary model coefficient training circuit is configured to:
train the auxiliary coefficient of the auxiliary model coefficient training circuit by performing modeling by using the predistortion signal and the harmonic feedback signal that are input into the auxiliary model coefficient training circuit,
obtain a fourth auxiliary coefficient after training, and transmit the fourth auxiliary coefficient to the fifth auxiliary filtering subcircuit and the sixth auxiliary filtering subcircuit.

10. The apparatus according to claim 9, wherein the fifth auxiliary filtering subcircuit is configured to:
construct, according to the intermediate frequency signal input into the predistortion processing circuit, a harmonic reference signal corresponding to the intermediate frequency signal,
perform filtering processing on the harmonic reference signal, and
input a fifth output signal obtained by using the fourth auxiliary coefficient into the third predistortion processing subcircuit;
the third predistortion processing subcircuit is configured to:
generate a predistortion vector according to a preset predistortion model by using the fifth output signal that is output by the fifth auxiliary filtering subcircuit and a clipping-processed baseband signal that is input into the third predistortion processing subcircuit,
multiply the predistortion vector by the predistortion coefficient to obtain the predistortion signal, and output the predistortion signal;

the sixth auxiliary filtering subcircuit is configured to:
perform, by using the fourth auxiliary coefficient, filtering processing on the fundamental wave feedback signal output by the radio frequency signal feedback circuit, and
input an obtained sixth output signal into a predistortion model processing subcircuit; and
the third predistortion coefficient processing subcircuit is configured to:
perform nonlinear modeling according to the sixth output signal, a fundamental wave feedback signal input into the third predistortion coefficient processing subcircuit, and the predistortion signal,
train the predistortion coefficient of the predistortion model coefficient training circuit, and
obtain the predistortion coefficient.

11. A predistortion processing method comprising:
receiving, by an auxiliary feedback circuit, an amplified analog signal, extracting a nonlinear distortion signal from the amplified analog signal, obtaining a feedback signal corresponding to the nonlinear distortion signal, and inputting the feedback signal into an auxiliary model coefficient training circuit;
receiving, by the auxiliary model coefficient training circuit, the feedback signal and a predistortion signal that is output by a predistortion processing circuit, training an auxiliary coefficient of the auxiliary model coefficient training circuit according to the feedback signal and the predistortion signal that is output by the predistortion processing circuit, and transmitting a first auxiliary coefficient obtained through training to the predistortion processing circuit;
receiving, by a radio frequency signal feedback circuit, the amplified analog signal, extracting a fundamental wave signal from the amplified analog signal, obtaining a fundamental wave feedback signal corresponding to the fundamental wave signal, and inputting the fundamental wave feedback signal into a predistortion model coefficient training circuit;
receiving, by the predistortion model coefficient training circuit, the fundamental wave feedback signal and the predistortion signal that is output by the predistortion processing circuit, training a predistortion coefficient of the predistortion model coefficient training circuit according to the fundamental wave feedback signal and the predistortion signal that is output by the predistortion processing circuit, and transmitting a predistortion coefficient obtained through training to the predistortion processing circuit; and
performing, by the predistortion processing circuit, predistortion processing on an input intermediate frequency signal by performing nonlinear modeling according to the first auxiliary coefficient and the predistortion coefficient, and outputting a predistortion signal obtained through predistortion processing.

12. The method according to claim 11, wherein the nonlinear distortion signal comprises an envelope signal, and the receiving, by an auxiliary feedback circuit, an amplified analog signal, extracting a nonlinear distortion signal from the amplified analog signal, obtaining a feedback signal corresponding to the nonlinear distortion signal, and inputting the feedback signal into an auxiliary model coefficient training circuit specifically comprises:
receiving, by the auxiliary feedback circuit, the amplified analog signal, extracting the envelope signal from the amplified analog signal, performing sampling processing on the envelope signal, obtaining an envelope feedback signal corresponding to the envelope signal, and inputting the envelope feedback signal into the auxiliary model coefficient training circuit.

13. The method according to claim 12, wherein the predistortion processing circuit comprises a first auxiliary filtering subcircuit and a first predistortion processing subcircuit, the predistortion model coefficient training circuit comprises a second auxiliary filtering subcircuit and a first predistortion coefficient processing subcircuit, and the method further comprises:
training, by the auxiliary model coefficient training, the auxiliary coefficient of the auxiliary model coefficient training by performing modeling by using the predistortion signal and the envelope feedback signal that are input into the auxiliary model coefficient training, obtaining a second auxiliary coefficient after training, and transmitting the second auxiliary coefficient to the first auxiliary filtering subcircuit and the second auxiliary filtering subcircuit.

14. The method according to claim 13, wherein the method further comprises:
constructing, by the first auxiliary filtering subcircuit according to the intermediate frequency signal input into the predistortion processing circuit, an envelope reference signal corresponding to the intermediate frequency signal, performing filtering processing on the envelope reference signal by using the second auxiliary coefficient, and inputting an obtained first output signal into the first predistortion processing subcircuit;
generating, by the first predistortion processing subcircuit, a predistortion vector according to a preset predistortion model by using the first output signal output by the first auxiliary filtering subcircuit and a clipping-processed baseband signal that is input into the first predistortion processing subcircuit, multiplying the predistortion vector by the predistortion coefficient to obtain the predistortion signal, and outputting the predistortion signal;
performing, by the second auxiliary filtering subcircuit by using the second auxiliary coefficient, filtering processing on the fundamental wave feedback signal output by the radio frequency signal feedback, and inputting an obtained second output signal into a predistortion model processing subcircuit; and
performing, by the first predistortion coefficient processing subcircuit, nonlinear modeling according to the second output signal, the fundamental wave feedback signal input into the first predistortion coefficient processing subcircuit, and the predistortion signal, and training the predistortion coefficient of the predistortion model coefficient training circuit to obtain the predistortion coefficient.

15. The method according to claim 11, wherein the nonlinear distortion signal comprises an envelope signal and a harmonic signal, and the method further comprises:
extracting, by the auxiliary feedback circuit, the envelope signal and the harmonic signal from the analog signal, performing sampling processing on the envelope signal and the harmonic signal, obtaining an envelope feedback signal corresponding to the envelope signal and a harmonic feedback signal corresponding to the harmonic signal, and inputting the envelope feedback signal and the harmonic feedback signal into the auxiliary model coefficient training circuit.

16. The method according to claim 15, wherein the predistortion processing circuit comprises a third auxiliary filtering subcircuit and a second predistortion processing subcircuit, the predistortion model coefficient training circuit comprises a fourth auxiliary filtering subcircuit and a second predistortion coefficient processing subcircuit, and the method further comprises:

training, by the auxiliary model coefficient training circuit, the auxiliary coefficient by using the predistortion signal, the envelope feedback signal, and the harmonic feedback signal that are input into the auxiliary model coefficient training circuit, obtaining a third auxiliary coefficient after training, and transmitting the third auxiliary coefficient to the third auxiliary filtering subcircuit and the fourth auxiliary filtering subcircuit.

17. The method according to claim 16, wherein the method further comprises: constructing, by the third auxiliary filtering subcircuit according to the intermediate frequency signal input into the predistortion processing circuit, an envelope reference signal and a harmonic reference signal that correspond to the intermediate frequency signal, performing filtering processing on the envelope reference signal and the harmonic reference signal by using the third auxiliary coefficient, and inputting an obtained third output signal into the second predistortion processing subcircuit;

generating, by the second predistortion processing subcircuit, a predistortion vector according to a preset predistortion model by using the third output signal output by the third auxiliary filtering subcircuit and a clipping-processed baseband signal that is input into the second predistortion processing subcircuit, multiplying the predistortion vector by the predistortion coefficient to obtain the predistortion signal, and outputting the predistortion signal;

performing, by the fourth auxiliary filtering subcircuit by using the third auxiliary coefficient, filtering processing on the fundamental wave feedback signal output by the radio frequency signal feedback circuit, and inputting an obtained fourth output signal into the second predistortion coefficient processing subcircuit; and performing, by the second predistortion coefficient processing subcircuit, nonlinear modeling according to the fourth output signal, a fundamental wave feedback signal input into the second predistortion coefficient processing subcircuit, and the predistortion signal, and training the predistortion coefficient of the predistortion model coefficient training circuit to obtain the predistortion coefficient.

18. The method according to claim 11, wherein the nonlinear distortion signal comprises a harmonic signal, and the method further comprises:

extracting, by the auxiliary feedback, the harmonic signal from the analog signal, performing sampling processing on the harmonic signal, obtaining a harmonic feedback signal corresponding to the harmonic signal, and inputting the harmonic feedback signal into the auxiliary model coefficient training circuit.

19. The method according to claim 18, wherein the predistortion processing circuit comprises a fifth auxiliary filtering sub and a third predistortion processing subcircuit, the predistortion model coefficient training circuit comprises a sixth auxiliary filtering subcircuit and a third predistortion coefficient processing subcircuit, and the method further comprises:

training, by the auxiliary model coefficient training circuit, the auxiliary coefficient by using the predistortion signal and the harmonic feedback signal that are input into the auxiliary model coefficient training circuit, obtaining a fourth auxiliary coefficient after training, and transmitting the fourth auxiliary coefficient to the fifth auxiliary filtering subcircuit and the sixth auxiliary filtering subcircuit.

20. The method according to claim 19, wherein the method further comprises:

constructing, by the fifth auxiliary filtering subcircuit according to the intermediate frequency signal input into the predistortion processing circuit, a harmonic reference signal corresponding to the intermediate frequency signal, performing filtering processing on the harmonic reference signal, and inputting a fifth output signal obtained by using the fourth auxiliary coefficient into the third predistortion processing subcircuit;

generating, by the third predistortion processing subcircuit, a predistortion vector according to a preset predistortion model by using the fifth output signal that is output by the fifth auxiliary filtering subcircuit and a clipping-processed baseband signal that is input into the third predistortion processing subcircuit, multiplying the predistortion vector by the predistortion coefficient to obtain the predistortion signal, and outputting the predistortion signal;

performing, by the sixth auxiliary filtering subcircuit by using the fourth auxiliary coefficient, filtering processing on the fundamental wave feedback signal output by the radio frequency signal feedback circuit, and inputting an obtained sixth output signal into a predistortion model processing subcircuit; and performing, by the third predistortion coefficient processing subcircuit, nonlinear modeling according to the sixth output signal, a fundamental wave feedback signal input into the third predistortion coefficient processing subcircuit, and the predistortion signal, and training the predistortion coefficient of the predistortion model coefficient training circuit to obtain the predistortion coefficient.

* * * * *